(12) United States Patent
Hung et al.

(10) Patent No.: US 12,720,941 B2
(45) Date of Patent: Aug. 25, 2026

(54) DISPLAY PANEL HAVING AN ENCAPSULATION STRUCTURE ALIGNING WITH A LIGHT EMITTING PATTERN AND AN ELECTRODE

(71) Applicant: AUO Corporation, Hsinchu (TW)

(72) Inventors: Chun-Cheng Hung, Hsinchu (TW); Han-Chung Lai, Hsinchu (TW); Wen Jen Li, Hsinchu (TW); Yang-Pei Hu, Hsinchu (TW); Zhi-Jian Yu, Hsinchu (TW); Bing-Chen Liu, Hsinchu (TW)

(73) Assignee: AUO Corporation, Hsinchu City (TW)

( * ) Notice: Subject to any disclaimer, the term of this patent is extended or adjusted under 35 U.S.C. 154(b) by 334 days.

(21) Appl. No.: 18/523,911

(22) Filed: Nov. 30, 2023

(65) Prior Publication Data

US 2024/0421179 A1 Dec. 19, 2024

(30) Foreign Application Priority Data

Jun. 17, 2023 (TW) ................................ 112122800
Jun. 29, 2023 (TW) ................................ 112124308

(51) Int. Cl.
*H10H 29/14* (2025.01)
*H10D 86/40* (2025.01)
(Continued)

(52) U.S. Cl.
CPC ........ *H10H 29/142* (2025.01); *H10D 86/441* (2025.01); *H10D 86/60* (2025.01); *H10H 20/853* (2025.01); *H10K 59/122* (2023.02)

(58) Field of Classification Search
CPC ...... H10D 86/40; H10D 86/441; H10D 86/60; H10H 20/852; H10H 20/853;
(Continued)

(56) References Cited

U.S. PATENT DOCUMENTS 9,006,009 B2 4/2015 Kim et al.
9,425,438 B2 8/2016 Kim et al.
(Continued)

FOREIGN PATENT DOCUMENTS

CN 103022381 4/2013
CN 104022139 9/2014
(Continued)

*Primary Examiner* — Cheung Lee
(74) *Attorney, Agent, or Firm* — JCIPRNET

(57) ABSTRACT

A display panel including a driving circuit layer, multiple light emitting devices and multiple encapsulation structures is provided. Each of the light emitting devices includes a first electrode, a light emitting pattern, a second electrode and a pixel definition layer. The light emitting pattern is disposed on the first electrode. The second electrode is disposed on the light emitting pattern. The pixel definition layer is disposed on the driving circuit layer. The light emitting pattern and the second electrode cover the pixel definition layer, and the first electrode located in a pixel opening of the pixel definition layer. The encapsulation structures cover the light emitting devices and each includes a first encapsulation pattern. Edges of the first encapsulation pattern, the light emitting pattern and the second electrode overlapping with each other are aligned with each other.

17 Claims, 17 Drawing Sheets

(51) Int. Cl.

| | |
|---|---|
| ***H10D 86/60*** | (2025.01) |
| ***H10H 20/853*** | (2025.01) |
| ***H10K 59/122*** | (2023.01) |

(58) Field of Classification Search

CPC .... H10H 29/011; H10H 29/014; H10H 29/30; H10H 29/32; H10H 29/34; H10H 29/345; H10H 29/352; H10H 29/362; H10H 29/37; H10H 29/39; H10H 29/41; H10H 29/45; H10H 29/49; H10H 29/8517; H10H 29/852; H10H 29/853; H10H 29/8552; H10H 29/922; H10H 29/942; H10H 29/962; H10H 29/142; H10K 59/122; H10K 59/124; H10K 59/131; H10K 59/80521; H10K 59/873; H10K 59/8731; H10K 59/88

See application file for complete search history.

(56) References Cited

U.S. PATENT DOCUMENTS

| | | | | |
|---|---|---|---|---|
| 9,960,376 | B2 | 5/2018 | Kim et al. | |
| 10,049,792 | B2 | 8/2018 | Ko et al. | |
| 10,205,121 | B2 | 2/2019 | Song et al. | |
| 10,256,428 | B2 | 4/2019 | Kim et al. | |
| 10,547,017 | B2 | 1/2020 | Kim et al. | |
| 11,637,160 | B2 | 4/2023 | Lee et al. | |
| 2018/0183003 | A1* | 6/2018 | Han | H10D 86/411 |
| 2018/0254365 | A1 | 9/2018 | Kim | |
| 2022/0149129 | A1 | 5/2022 | Park et al. | |

FOREIGN PATENT DOCUMENTS

| | | |
|---|---|---|
| CN | 108039421 | 5/2018 |
| CN | 108231859 | 6/2018 |
| CN | 108461645 | 8/2018 |
| CN | 110729332 | 1/2020 |
| CN | 113394245 | 9/2021 |
| CN | 214313212 | 9/2021 |
| CN | 114464653 | 5/2022 |
| CN | 114520257 | 5/2022 |
| CN | 115623811 | 1/2023 |
| GB | 2590427 | 6/2021 |
| KR | 20150025912 | 3/2015 |
| KR | 20170030311 | 3/2017 |
| TW | I679788 | 12/2019 |

* cited by examiner

DISPLAY PANEL HAVING AN ENCAPSULATION STRUCTURE ALIGNING WITH A LIGHT EMITTING PATTERN AND AN ELECTRODE

CROSS-REFERENCE TO RELATED APPLICATION

This application claims the priority benefit of Taiwan application serial no. 112122800 filed on Jun. 17, 2023 and Taiwan application serial no. 112124308 filed on Jun. 29, 2023. The entirety of the above-mentioned patent applications are hereby incorporated by reference herein and made a part of this specification.

BACKGROUND

Technical Field

The disclosure relates to a display panel, and in particular to a self-luminous display panel.

Description of Related Art

The current manufacturing of organic light emitting diode (OLED) display panels may be mainly divided into two categories: OLED evaporation technology and OLED lithography technology. OLED evaporation technology uses a fine metal mask (FMM) to form a required light emitting pattern through a vacuum evaporation during the manufacturing process. However, the expensive fine metal masks not only increase the manufacturing cost of the evaporation technology, but also fail to meet the process requirements of high-resolution. OLED lithography technology uses a lithography process to define the required light emitting pattern on the entire surface of the evaporated light emitting material structure. Although the light emitting patterns of different colors may be completed by repeating the evaporation and lithography technology of the material structure many times, the light emitting pattern previously formed is easily oxidized during the manufacturing process, resulting in being unable to be lit.

SUMMARY

The disclosure provides a display panel with high production yield and good encapsulation performance.

The display panel of the disclosure includes a driving circuit layer, multiple light emitting devices and multiple encapsulation structures. The light emitting devices are disposed on the driving circuit layer, and each includes a first electrode, a light emitting pattern, a second electrode and a pixel definition layer. The light emitting pattern is disposed on the first electrode. The second electrode is disposed on the light emitting pattern. The pixel definition layer is disposed on the driving circuit layer, and has a pixel opening overlapping the first electrode. The light emitting pattern and the second electrode cover the pixel definition layer, the first electrode located in the pixel opening of the pixel definition layer and part of the driving circuit layer located outside the pixel opening of the pixel definition layer. The light emitting pattern is electrically connected to the first electrode through the pixel opening. The encapsulation structures cover the light emitting devices and each includes a first encapsulation pattern. Edges of the first encapsulation pattern, the light emitting pattern and the second electrode overlapping with each other are aligned with each other.

Based on the above, in the display panel according to an embodiment of the disclosure, the light emitting pattern of the light emitting device and the second electrode extend from the inside of the pixel opening of the pixel definition layer to the outside of the pixel opening, and cover the pixel definition layer. Using the encapsulation structure as a hard mask to define the light emitting pattern and the second electrode may not only increase an alignment accuracy of the process, but also avoid the problem of causing the light emitting pattern previously formed during a manufacturing process to be oxidized and unable to be lit.

DESCRIPTION OF THE EMBODIMENTS

Figure 1:
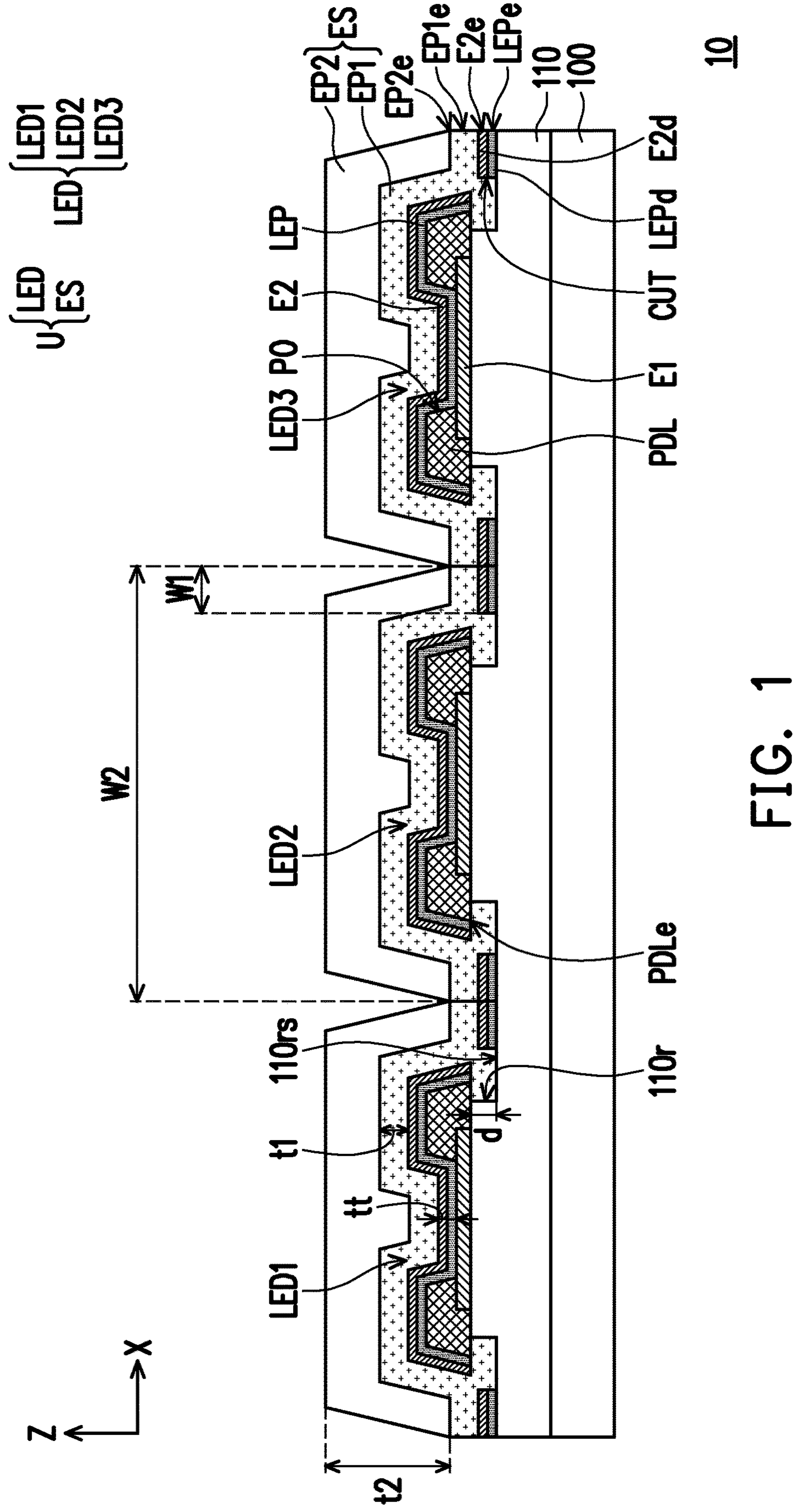
FIG. 1 is a schematic cross-sectional view of a display panel according to the first embodiment of the disclosure.

The usages of "approximately", "close to", or "substantially" throughout the specification include the indicated value and an average value within an acceptable deviation range of the specific value confirmed by those skilled in the art, considering the measurement in question and a specific number of errors related to the measurement (that is, the limitation of measurement system). For example, "approximately" may mean to be within one or more standard deviations of the value, or within ±30%, ±20%, ±10%, or ±5%. Furthermore, the usages of "approximately", "close to" or "substantially" throughout the specification allow selection of a more acceptable deviation scope or standard deviation depending on optical properties, etching properties, or other properties, and it is not necessary to use one standard deviation for all properties.

In the accompanying drawings, thicknesses of layers, films, panels, regions and so on are exaggerated for clarity. It should be understood that when an element such as a layer, a film, an area, or a substrate is described as being "on" another element or "connected to" another element, the element may be directly on another element or connected to another element, or there may be other elements interposed therebetween. In contrast, when an element is described as being "directly on another element" or "directly connected to" another element, there is no other element therebetween. Herein, "connect" used in the specification may refer to physical and/or electrical connection. Furthermore, "electrically connect" or "coupled to" may mean that there are other elements interposed between two elements.

Moreover, relative terms such as "below" or "bottom" and "above" or "top" may serve to describe the relation between one element and another element in the text according to the illustration of the drawings. It should also be understood that the relative terms are intended to include different orientations of a device in addition to the orientation shown in the drawings. For example, if a device in the accompanying drawings is flipped, an element described as being on the "lower" side of other elements shall be re-orientated to be on the "upper" side of other elements. Thus, the exemplary term "lower" may cover the orientations of "upper" and "lower," depending on the specific orientations of the accompanying drawings. Similarly, if a device in the accompanying drawings is flipped, an element described as being "below" other elements shall be re-orientated to be "above" other elements. Thus, the exemplary term "above" or "below" may cover the orientations of above and below.

Exemplary embodiments are described with cross-sectional views of schematic illustrations of ideal embodiments. Thus, shape alterations as a result of, for example, manufacturing techniques and/or tolerances may be expected, and the illustrated regions of the embodiments described herein should not be construed to particular shapes but include shape deviations due to, for example, manufacturing. For example, regions shown or described as being flat may generally have rough and/or non-linear features. Furthermore, the acute angles shown may be round. Therefore, the regions illustrated in the drawings are only schematic representations and are not intended to illustrate the exact shapes of the regions or to limit the scope of the claims.

Reference will now be made in detail to the exemplary embodiments. Examples of exemplary embodiments are described in the accompanying drawings. Wherever possible, the same reference symbols are used to denote the same or similar parts in the drawings and the description.

FIG. 1 is a schematic cross-sectional view of a display panel according to the first embodiment of the disclosure. FIG. 2A to FIG. 2E are schematic cross-sectional views of a manufacturing process of the display panel of FIG. 1. For the sake of clarity, FIG. 1 shows only three of multiple display units U of a display panel 10. Referring to FIG. 1, the display panel 10 includes a substrate 100, a driving circuit layer 110, multiple light emitting devices LED and multiple encapsulation structures ES. The driving circuit layer 110 is disposed on the substrate 100. The light emitting devices LED are disposed on the driving circuit layer 110. The encapsulation structures ES respectively cover the light emitting devices LED. In this embodiment, the light emitting device LED and the encapsulation structure ES overlapping each other along a direction Z may constitute one display unit U of the display panel 10. Multiple display units U may be arranged in an array on the driving circuit layer 110, and any two adjacent display units U are connected to each other. That is, there is no distance between any two adjacent display units U.

For example, the driving circuit layer 110 may be provided with multiple pixel circuits (not shown), multiple scanning lines (not shown), multiple data lines (not shown), and multiple power lines (not shown). The driving circuit layer 110 is suitable for individually controlling the light emitting device LED to emit light at the same or different intensities for displaying images. In response to T and C representing respectively an active elements and a capacitor in the pixel circuit, the driving circuit layer 110 may be a 1T1C architecture, a 2T1C architecture, a 3T1C architecture, a 3T2C architecture, a 4T1C architecture, a 4T2C architecture, a 5T1C architecture, a 5T2C architecture, a 6T1C architecture, a 6T2C architecture, a 7T2C architecture, or any possible pixel circuit architecture to drive the light emitting device LED. However, the disclosure is not limited thereto.

In this embodiment, the light emitting devices LED may include multiple first light emitting devices LED1, multiple second light emitting devices LED2, and multiple third light emitting devices LED3 alternately arranged along a direction X. Light emitting colors of the first light emitting device LED1, the second light emitting device LED2 and the third light emitting device LED3 may be a red color, a green color and a blue color respectively. However, the disclosure is not limited thereto.

The light emitting device LED includes a first electrode E1, a light emitting pattern LEP, a second electrode E2 and a pixel definition layer PDL. The first electrode E1 and the pixel definition layer PDL are disposed on the driving circuit layer 110. The pixel definition layer PDL covers part of the first electrode E1 and exposes part of a surface of the first electrode E1. More specifically, the pixel definition layer PDL has a pixel opening PO overlapping the first electrode E1 along a normal direction of the substrate 100 (for example, the direction Z). Unless otherwise mentioned below, the overlapping relationship between the two elements means overlapping each other along the direction Z, so the overlapping direction will not be described again.

The light emitting pattern LEP is disposed on the first electrode E1. The second electrode E2 is disposed on the light emitting pattern LEP. In particular, the light emitting pattern LEP and the second electrode E2 cover the pixel definition layer PDL, part of the surface of the first electrode E1 exposed by the pixel opening PO of the pixel definition layer PDL, and part of the driving circuit 110 disposed outside the pixel opening PO of the pixel definition layer PDL. The light emitting pattern LEP is electrically connected to the first electrode E1 through the pixel opening PO.

In this embodiment, the driving circuit layer 110 may have a notch **110*r* overlapping an outer edge PDLe of the pixel definition layer PDL, but is not limited thereto. It should be noted that the light emitting pattern LEP covers the pixel definition layer PDL and extends from the inside of the pixel opening PO to the outside of the pixel definition layer PDL. The light emitting pattern LEP and the second electrode E2 form a break CUT at the notch 110*r* of the driving circuit layer 110. Preferably, a ratio of a distance d between a notch bottom surface 110*rs* of the driving circuit layer 110 defining the notch 110*r* and the pixel definition layer PDL to a total film thickness tt of the light emitting pattern LEP and the second electrode E2 may be within a range of 1 to 3. The distance d and the total film thickness tt are defined, for example, along the normal direction of the substrate 100 (for example, the direction Z). Accordingly, it is ensured that the light emitting pattern LEP and the second electrode E2 stably form the break CUT at the notch 110***r* of the driving circuit layer 110.

From another point of view, the light emitting pattern LEP and the second electrode E2 of the light emitting device LED have a dummy part that does not overlap the pixel definition layer PDL and is located outside the pixel opening PO, such as a dummy part LEPd of the light emitting pattern LEP and a dummy part E2*d* of the second electrode E2. The dummy part LEPd of the light emitting pattern LEP and the dummy part E2*d* of the second electrode E2 respectively extend from an edge LEPe of the light emitting pattern LEP and an edge E2*e* of the second electrode E2 to the break CUT of the light emitting pattern LEP and the second electrode E2. More specifically, part of the second electrode E2 covering the pixel definition layer PDL and the dummy part E2*d* are electrically independent from each other. Part of the light emitting pattern LEP covering the pixel definition layer PDL and the dummy part LEPd are electrically independent form each other. Therefore, when the first electrode E1 and the second electrode E2 are enabled to have a potential difference, the dummy part LEPd of the light emitting pattern LEP does not emit light.

On the other hand, the encapsulation structure ES covering the light emitting device LED may include a first encapsulation pattern EP1 and a second encapsulation pattern EP2 sequentially stacked. That is, the first encapsulation pattern EP1 is disposed between the second encapsulation pattern EP2 and the overlapping light emitting device LED. It is particularly noted that the first encapsulation pattern EP1 of the encapsulation structure ES covers the second electrode E2 of the light emitting device LED and fills the notch 110*r* of the driving circuit layer 110 through the break CUT between the light emitting pattern LEP and the second electrode E2. In other words, the notch 110*r* of the outer edge PDLe of the driving circuit layer 110 overlapping the pixel definition layer PDL and the break CUT between the light emitting pattern LEP and the second electrode E2 are filled with the first encapsulation pattern EP1 of the encapsulation structure ES.

Firstly, through the disposition of the notch 110*r*, the first encapsulation pattern EP1 may completely cover a part of the light emitting pattern LEP being electrically connected to the first electrode E1. Accordingly, it is possible to avoid a failure of the encapsulation of the light emitting device LED previously formed during the manufacturing process of the light emitting device formed later, causing the light emitting pattern LEP to be oxidized and unable to be lit. Therefore, a production yield of the display panel 10 may be greatly improved. In order to take into account an aperture ratio of the pixels and an encapsulation effect of the display panel, the ratio of a width W1 of the dummy part LEPd of the light emitting pattern LEP along a direction X to a width W2 of the first encapsulation pattern EP1 along the direction X is preferably in a range of 0.04 to 0.2.

In this embodiment, the first encapsulation pattern EP1 of each of the encapsulation structures ES may have a same film thickness t1, and the second encapsulation pattern EP2 of each of the encapsulation structures ES may have a same film thickness t2. However, the disclosure is not limited thereto. The film thickness here is, for example, the thickness of the film layer along the direction Z.

On the other hand, in this embodiment, an edge EP1*e* of the first encapsulation pattern EP1, the edge LEPe of the light emitting pattern LEP, and the edge E2*e* of the second electrode E2 that are aligned with each other may selectively be aligned with an edge EP2*e* of the second encapsulation pattern EP2. However, the disclosure is not limited thereto. Firstly, characteristics of alignment of each of the film layers are due to the manufacturing process of the overlapping light emitting device LED and the encapsulation structure ES.

The following describes the manufacturing process of one display unit U of the display panel 10 as an example for exemplary description.

Figure 2A:
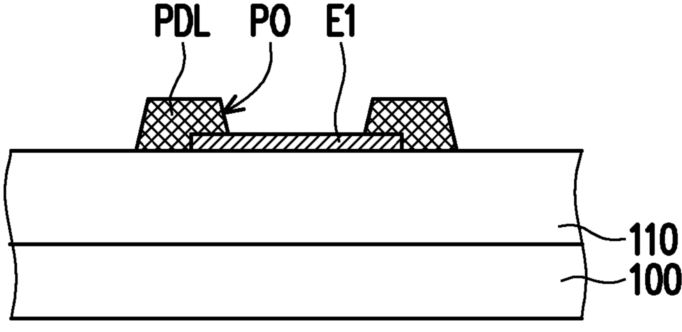
FIG. 2A to FIG. 2E are schematic cross-sectional views of a manufacturing process of the display panel of FIG. 1.

Referring to FIG. 2A, the manufacturing method of the display panel 10 may include as follows. The driving circuit layer 110 is formed on the substrate 100. The first electrode E1 and the pixel definition layer PDL are formed on the driving circuit layer 110. The pixel definition layer PDL overlaps part of the first electrode E1. The pixel opening PO of the pixel definition layer PDL exposes part of the surface of the first electrode E1.

Taking conductivity into account, the first electrode E1 is generally selected as a single-layer or multi-layer stack structure made of at least one metal material, but is not limited thereto. The first electrode E1 may also be selected from an alloy, a metal nitride material, a metal oxide material (such as indium tin oxide, indium zinc oxide, aluminum tin oxide, aluminum zinc oxide, etc.), a metal oxynitride material or any other applicable material. The material of the pixel definition layer PDL includes an inorganic material (such as silicon oxide, silicon nitride, silicon oxynitride, or a stack layer of at least two of the above materials), an organic material (such as polyesters (PET), polyenes, polypropionyls, polycarbonates, polyalkylene oxides, polyphenylenes, polyethers, polyketones, polyols, polyaldehydes, or other suitable materials, or combinations of the above components), or other suitable materials, or combination of the above materials.

Figure 2B:
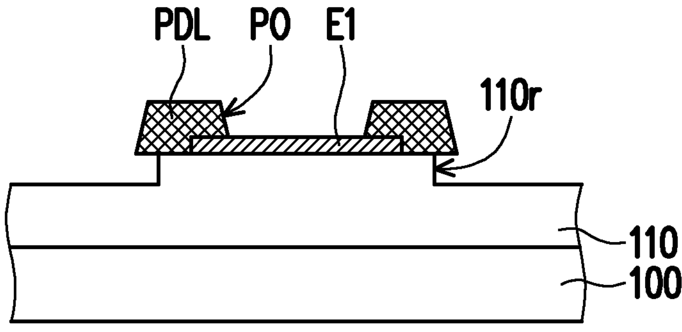

Referring to FIG. 2B, in this embodiment, the manufacturing method of the display panel 10 may further optionally include removing part of the driving circuit layer 110 overlapping the outer edge PDLe of the pixel definition layer PDL to form the notch 110*r*. For example, the driving circuit layer 110 may further be provided with an inorganic passivation layer covering on the pixel circuit or the signal line. The material of the inorganic passivation layer may include silicon oxide (SiOx) or silicon nitride (SiNx). The notch 110*r* may be formed by the inorganic passivation layer, but is not limited thereto. The method of forming the notch 110*r* may include performing a wet etching process on the inorganic passivation layer of the driving circuit layer 110 using the pixel definition layer PDL and the first electrode E1 as a hard mask, but is not limited thereto.

Figure 2C:
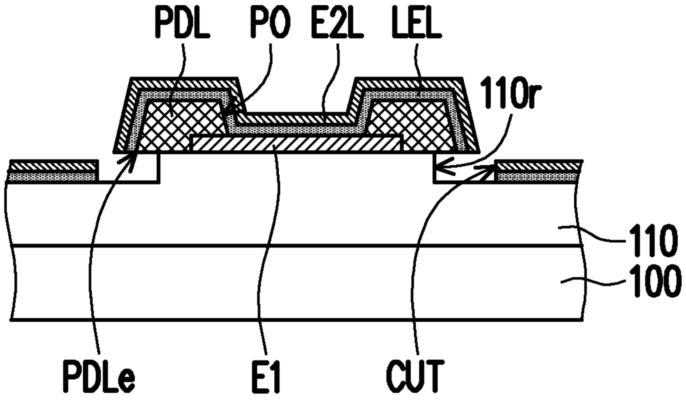

After the notch 110*r* of the driving circuit layer 110 is formed, a second electrode layer E2L and a light emitting material layer LEL are formed on the pixel definition layer PDL, as shown in FIG. 2C. The light emitting material layer LEL and the second electrode layer E2L formed entirely on the driving circuit layer 110 may be broken and form the break CUT due to the notch 110*r* formed by the driving circuit layer 110 retracting from the outer edge PDLe of the pixel definition layer PDL.

Based on the consideration of conductivity, the second electrode layer E2L generally selected as the single-layer or multi-layer stack structure made of at least one metal material, but is not limited thereto. The second electrode layer E2L may also be selected from the alloy, the metal nitride material, the metal oxide material (such as the indium tin oxide, the indium zinc oxide, the aluminum tin oxide, the aluminum zinc oxide, etc.), the metal oxynitride material or any other applicable material. For example, in this embodiment, the second electrode layer E2L may be made of an alloy material of silver metal and magnesium metal.

Figure 2D:
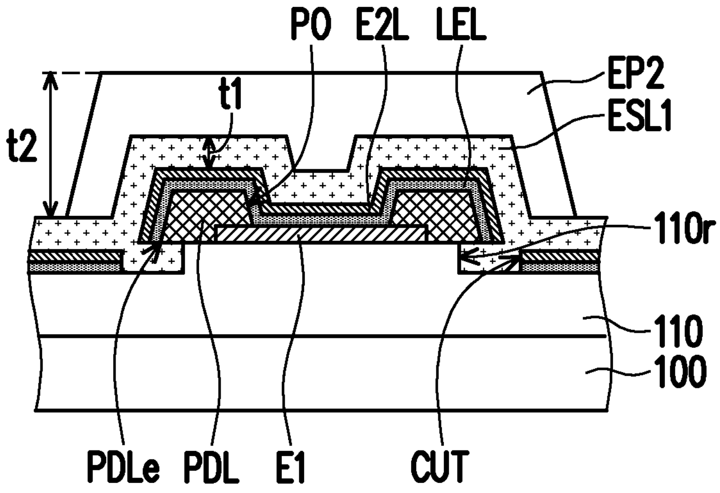

Referring to FIG. 2D, next, a first encapsulation material layer ESL1 is formed on the second electrode layer E2L. In particular, the first encapsulation material layer ESL1 covering the second electrode layer E2L is filled into the notch 110*r* of the driving circuit layer 110 through the break CUT between the light emitting material layer LEL and the second electrode layer E2L, so as to completely cover the part electrically connected to the first electrode E1 in the light emitting material layer LEL and the second electrode layer E2L. Considering a depth of the notch 110*r* of the driving circuit layer 110, the film thickness t1 of the first encapsulation material layer ESL1 may preferably be in the range of 5,000 angstroms to 40,000 angstroms.

The first encapsulation material layer ESL1 may be a multi-layer film structure of the inorganic material (for example, the silicon nitride) and the organic material (for example, acrylic, epoxy, hexamethyldisiloxane (HMDSO), or other applicable organic materials). For example, the first encapsulation material layer ESL1 may be a three-layer film structure of the inorganic material, the organic material, and the inorganic material.

After forming the first encapsulation material layer ESL1 distributed over an entire surface, the second encapsulation pattern EP2 is formed on the first encapsulation material layer ESL1. For example, forming the second encapsulation pattern EP2 may include forming a second encapsulation material layer on the first encapsulation material layer ESL1 and performing a lithography process on the second encapsulation material layer. The second encapsulation material layer is, for example, a negative photoresist layer. The lithography process includes, for example, exposing and developing the negative photoresist layer through an opening area of a metal mask to form the second encapsulation pattern EP2 overlapping the opening area. However, the disclosure is not limited thereto. In other embodiments, the second encapsulation pattern EP2 may also be formed by an exposure and development of a positive photoresist material, or formed by using a chemical vapor deposition (CVD) and patterning by a photolithography process.

In order to prevent the previously formed light emitting material layer LEL from being oxidized or degraded due to an extremely high temperature in a subsequent process, the material of the second encapsulation pattern EP2 is preferably selected from the material with a process temperature lower than 110° C. Considering the influence of the second encapsulation pattern EP2 on a visible light transmittance, a film thickness t2 of the second encapsulation pattern EP2 may preferably be in the range of 5000 angstroms to 35000 angstroms.

Figure 2E:
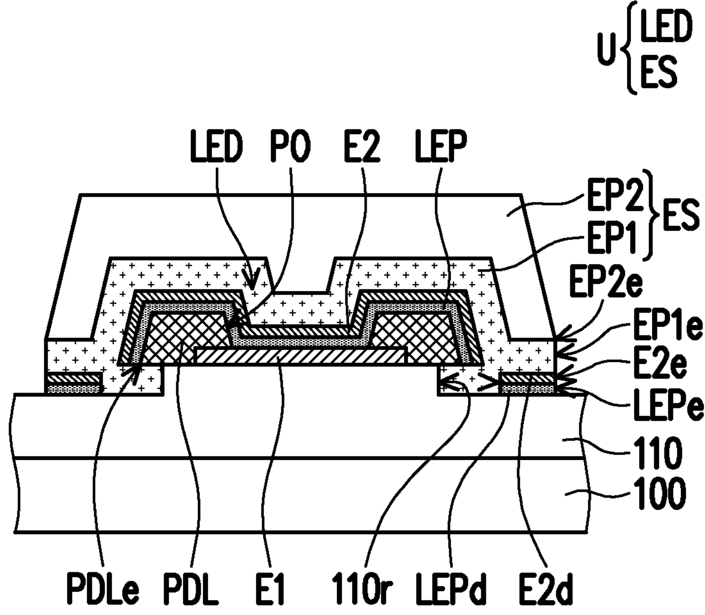

Referring to FIG. 2E, the second encapsulation pattern EP2 is used as a hard mask to perform an etching process on the first encapsulation material layer ESL1, the second electrode layer E2L, and the light emitting material layer LEL, so as to remove the part of these layers that does not overlap with the second encapsulation pattern EP2 and form the light emitting pattern LEP, the second electrode E2, and the first encapsulation pattern EP1. Therefore, after the etching process is completed, the edge LEPe of the light emitting pattern LEP, the edge E2*e* of the second electrode E2, and the edge EP1*e* of the first encapsulation pattern EP1 are respectively aligned with the edge EP2*e* of the second encapsulation pattern EP2. From another point of view, using the second encapsulation pattern EP2 as the hard mask to define the light emitting pattern LEP and the second electrode E2 may effectively increase an alignment accuracy of the encapsulation structure ES and the light emitting device LED, thereby improving an encapsulation yield.

At this point, the production of one display unit U of the display panel 10 is completed. Referring to FIG. 1, in this embodiment, the display panel 10 has the display units U of three different emitting colors. Therefore, the manufacturing process of FIG. 2A to FIG. 2E has to be repeated three times to produce the display units U of the three emitting colors in batches. For example, during the manufacturing process of the display panel 10, the display unit U including the first light emitting device LED1 may be formed first, then the display unit U including the second light emitting device LED2 may be formed, and finally the display unit U including the third light emitting device LED3 may be formed. However, the disclosure is not limited thereto.

It is worth mentioning that since the light emitting pattern LEP and the second electrode E2 have the break CUT at the outer edge PDLe of the pixel definition layer PDL, the first encapsulation pattern EP1 may completely cover the part of the light emitting pattern LEP being electrically connected to the first electrode E1 (i.e., the electroluminescent part) through the break CUT. Therefore, the display unit U (or the light emitting device) previously formed may still maintain the good encapsulation effect during the subsequent process of forming the display unit U of different emitting colors, which helps to significantly improve the production yield of the display panel 10.

In order to further improve the overall encapsulation effect, the display panel 10 may also optionally include an encapsulation layer ESL covering the encapsulation structures. The encapsulation layer ESL may be the multi-layer film structure of the inorganic material (for example, the silicon nitride) and the organic material (for example, acrylic, epoxy, hexamethyldisiloxane (HMDSO), or other applicable organic materials). For example, the encapsulation layer ESL may be the three-layer film structure of the inorganic material, the organic material, and the inorganic material.

In the following, other embodiments are provided to explain the disclosure in detail. The same members are labeled with the same reference numerals, and description of the same technical content is omitted. For the omitted parts, please refer to the above embodiments, which are not repeated herein.

Figure 3:
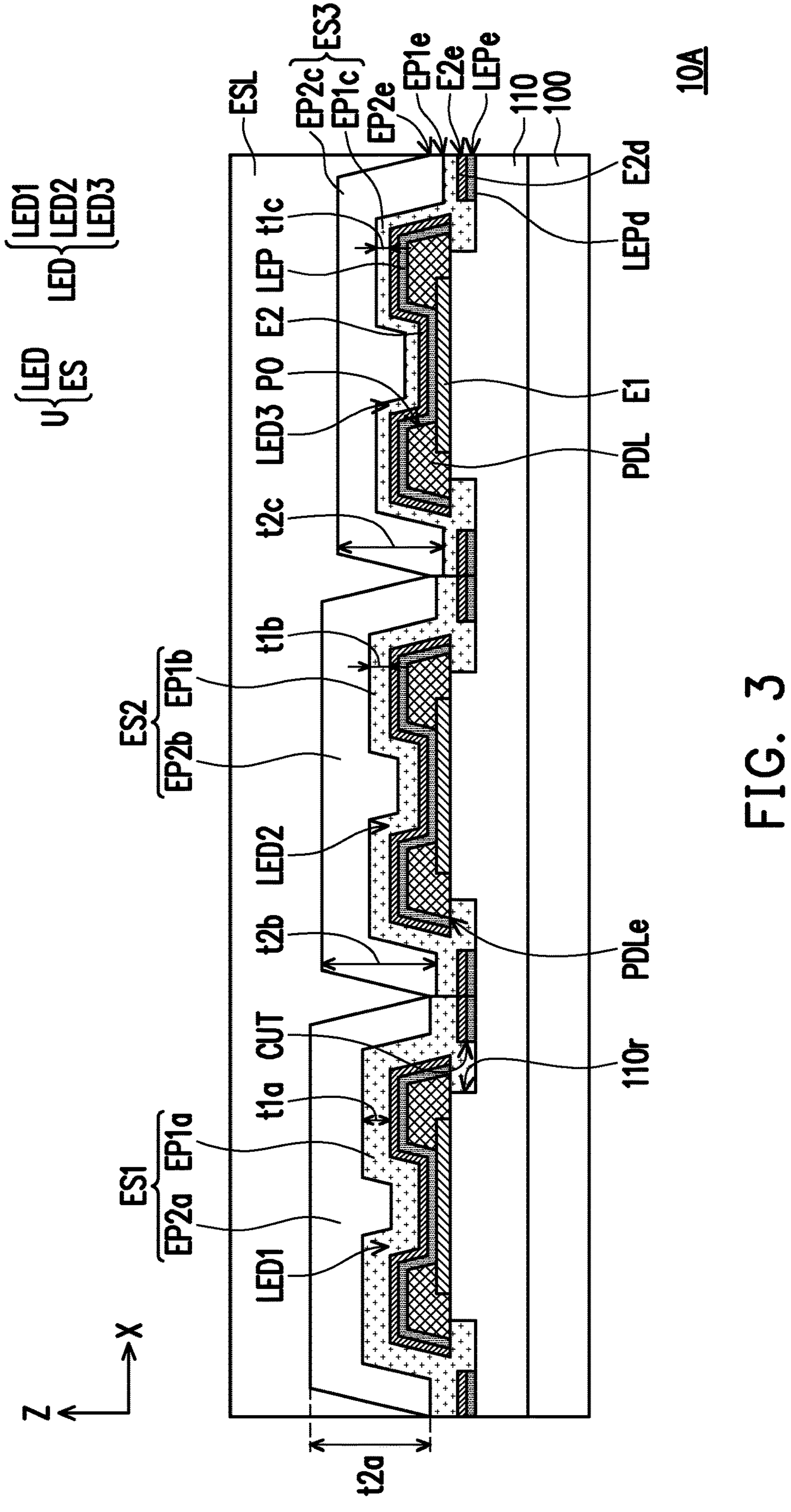
FIG. 3 is a schematic cross-sectional view of a display panel according to the second embodiment of the disclosure.
Figure 5:
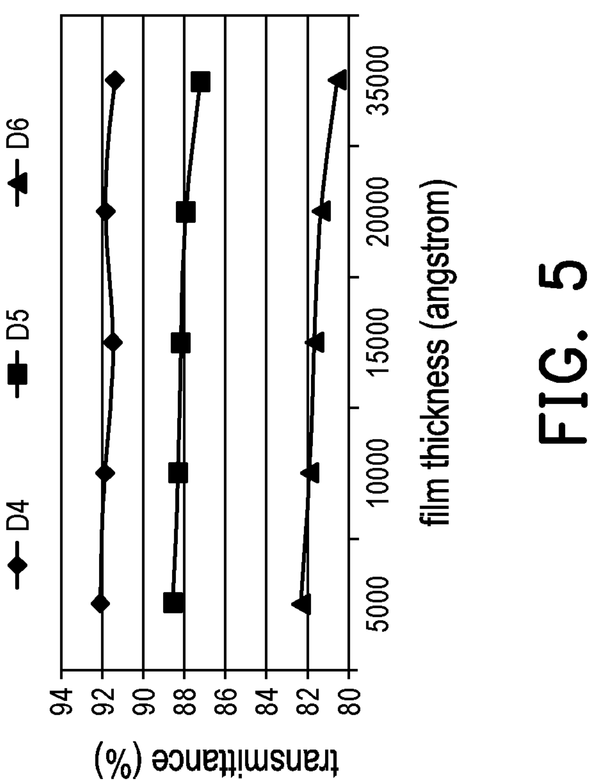
FIG. 5 is a distribution map of transmittance against film thickness of a second encapsulation pattern of FIG. 3.
Figure 4:
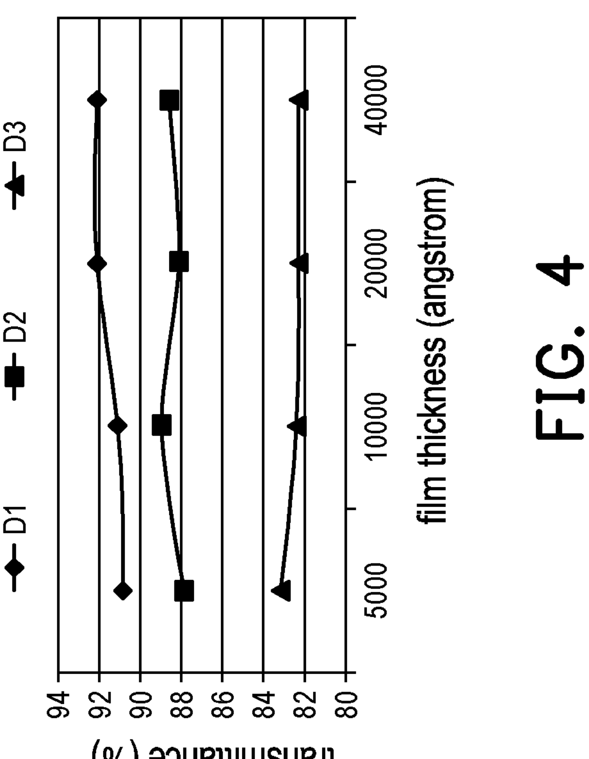
FIG. 4 is a distribution map of transmittance against film thickness of a first encapsulation pattern of FIG. 3.

FIG. 3 is a schematic cross-sectional view of a display panel according to the second embodiment of the disclosure. FIG. 4 is a distribution map of transmittance against film thickness of the first encapsulation pattern of FIG. 3. FIG. 5 is a distribution map of transmittance against film thickness of the second encapsulation pattern of FIG. 3. For clarity, FIG. 3 only illustrates three of the display units U of a display panel 10A.

Referring to FIG. 3, in this embodiment, the display panel 10A includes the first encapsulation structure ES1 covering the first light emitting device LED1, the second encapsulation structure ES2 covering the second light emitting device LED2, and a third encapsulation structure ES3 covering the third light emitting device LED3. Different from the encapsulation structures ES in FIG. 1 having respectively the first encapsulation pattern EP1 with the same film thickness t1 and the second encapsulation pattern EP2 with the same film thickness t2. In this embodiment, a film thickness t1*a* of a first encapsulation pattern EP1*a* of the first encapsulation structure ES1, a film thickness t1*b* of the first encapsulation pattern EP1*b* of the second encapsulation structure ES2, and a film thickness t1*c* of the first encapsulation pattern EP1*c* of the third encapsulation structure ES3 of the display panel 10A are all different. A film thickness t2*a* of a second encapsulation pattern EP2*a* of the first encapsulation structure ES1, a film thickness t2*b* of a second encapsulation pattern EP2*b* of the second encapsulation structure ES2, and a film thickness t2*c* of a second encapsulation pattern EP2*c* of the third encapsulation structure EP3 of the display panel 10A are all different.

Referring to FIG. 1 and FIG. 4, a distribution D1 shows the transmittance of the first encapsulation pattern EP1*a* of different thicknesses in a light emission waveband (such as a red-light waveband with a wavelength range of 600 nm to 650 nm) of the first light emitting device LED1. A distribution D2 shows the transmittance of the first encapsulation pattern EP1*b* of different thicknesses in the light emission waveband (such as a green-light waveband with a wavelength range of 500 nm to 550 nm) of the second light emitting device LED2. A distribution D3 shows the transmittance of the first encapsulation pattern EP1*c* of different thicknesses in the light emission waveband (such as a blue-light waveband with a wavelength range of 400 nm to 450 nm) of the third light emitting device LED3. It can be seen from the figure that when the film thickness of the first encapsulation pattern EP1*a* of the first encapsulation structure ES1 is 20,000 angstroms, the first encapsulation pattern EP1*a* has the maximum transmittance for the red light. When the film thickness of the first encapsulation pattern EP1*b* of the second encapsulation structure ES2 is 10,000 angstroms, the first encapsulation pattern EP1*b* has the maximum transmittance for the green light. When the film thickness of the first encapsulation pattern EP1*c* of the third encapsulation structure ES3 is 5000 angstroms, the first encapsulation pattern EP1*c* has the maximum transmittance for the blue light.

That is to say, when the first light emitting device LED1, the second light emitting device LED2, and the third light emitting device LED3 are respectively suitable for emitting the red light, the green light and the blue light (that is, the light emitting colors of the three light emitting devices are different from each other), the film thickness t1*c* of the first encapsulation pattern EP1*c* of the third encapsulation structure ES3 is less than the film thickness t1*b* of the first encapsulation pattern EP1*b* of the second encapsulation structure ES2, and the film thickness t1*b* of the first encapsulation pattern EP1*b* of the second encapsulation structure ES2 is less than the film thickness t1*a* of the first encapsulation pattern EP1*a* of the first encapsulation structure ES1 (as shown in FIG. 3). In this way, a maximum amount of light emitted from the display panel 10A may be effectively increased while ensuring the encapsulation effect of the first encapsulation pattern.

On the other hand, referring to FIG. 1 and FIG. 5, a distribution D4 shows the transmittance of the second encapsulation pattern EP2*a* of different thicknesses in the light emission waveband (such as the red-light waveband with the wavelength range of 600 nm to 650 nm) of the first light emitting device LED1. A distribution D5 shows the transmittance of the second encapsulation pattern EP2*b* of different thicknesses in the light emission waveband (such as the green-light waveband with the wavelength range of 500 nm to 550 nm) of the second light emitting device LED2. A distribution D6 shows the transmittance of the second encapsulation pattern EP2*c* of different thicknesses in the light emission waveband (such as the blue-light waveband with the wavelength range of 400 nm to 450 nm) of the third light emitting device LED3. It can be seen from the figure that although the transmittance of the second encapsulation pattern for each light emission waveband generally decreases as the film thickness increases, no matter what the film thickness is, the transmittance of the second encapsulation pattern EP2*a* for the red light is higher than the transmittance of the second encapsulation pattern EP2*b* for the green light, and the transmittance of the second encapsulation pattern EP2*b* for the green light are significantly higher than the transmittance of the second encapsulation pattern EP2*c* for the blue light.

That is to say, when the first light emitting device LED1, the second light emitting device LED2, and the third light emitting device LED3 are respectively suitable for emitting the red light, the green light, and the blue light (that is, the light emitting colors of the three light emitting devices are different from each other), the film thickness t2*a* of the second encapsulation pattern EP2*a* of the first encapsulation structure ES1 may be greater than the film thickness t2*b* of the second encapsulation pattern EP2*b* of the second encapsulation structure ES2, and the film thickness t2*b* of the second encapsulation pattern EP2*b* of the second encapsulation structure ES2 may be greater than the film thickness t2*c* of the second encapsulation pattern EP2*c* of the third encapsulation structure ES3 (as shown in FIG. 3). In this way, in response to ensuring the encapsulation effect of the second encapsulation pattern, the maximum amount of light emitted from display panel 10A may be further increased.

From another point of view, in order to reduce the difference in the transmittance of the encapsulation structure for different colors of light, in addition to the different configurations in the film thickness, the materials of the encapsulation structures where the light emitting devices LED of different light emitting colors overlap may also be selected differently. For example, the materials of the first encapsulation pattern EP1*a* of the first encapsulation structure ES1, the first encapsulation pattern EP1*b* of the second encapsulation structure ES2, and the first encapsulation pattern EP1*c* of the third encapsulation structure ES3 may be different from each other. The materials of the second encapsulation pattern EP2*a* of the structure ES1, the second encapsulation pattern EP2*b* of the second encapsulation structure ES2, and the second encapsulation pattern EP2*c* of the third encapsulation structure ES3 may also be different from each other.

Figure 6:
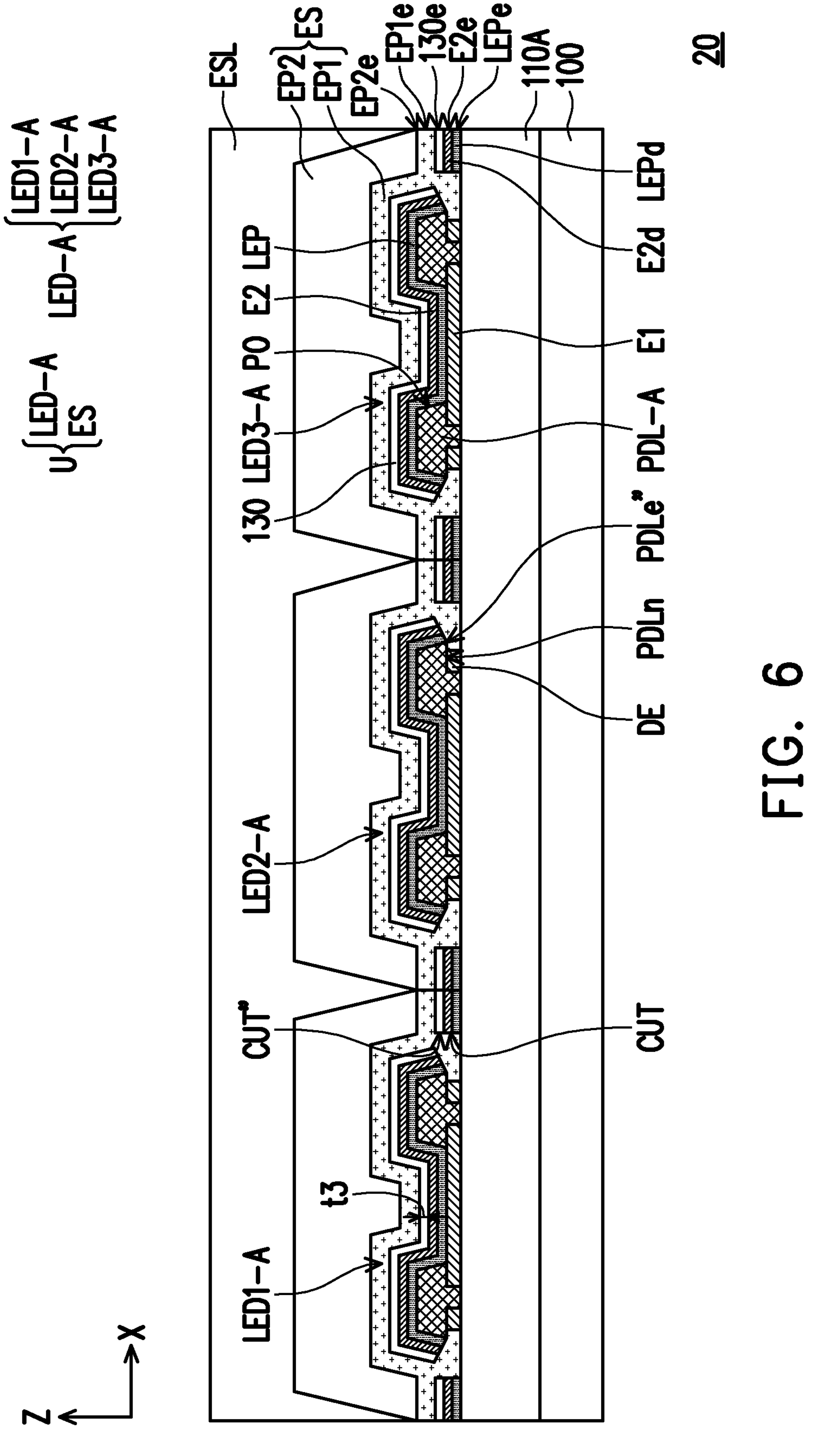
FIG. 6 is a schematic cross-sectional view of a display panel according to the third embodiment of the disclosure.

FIG. 6 is a schematic cross-sectional view of a display panel according to the third embodiment of the disclosure. For the sake of clarity, FIG. 6 only illustrates three of the display units U of a display panel 20. Referring to FIG. 6, the difference between the display panel 20 of this embodiment and the display panel 10 of FIG. 1 is that the compositions of the light emitting devices are different, and the light emitting pattern and the break of the second electrode are formed in different ways. Specifically, in order to prevent the second electrode E2 of the light-emitting device LED-A from being damaged in the subsequent process, the light emitting device LED-A of the display panel 20 may also include a protective layer 130 sandwiched between the second electrode E2 and the encapsulation structure ES. The protective layer 130 may be selected from a transparent conductive material (such as the indium tin oxide, the indium zinc oxide, the aluminum tin oxide, the aluminum zinc oxide, other applicable metal oxides, or the stack layer of at least two of the above materials). In this embodiment, a film thickness t3 of the protective layer 130 of each of a first light emitting device LED1-A, a second light emitting device LED2-A, and a third light emitting device LED3-A having different light emitting colors may be selectively the same. However, the disclosure is not limited thereto. Preferably, the film thickness t3 of the protective layer 130 may be less than or equal to 1500 angstroms.

On the other hand, a driving circuit layer 110A of this embodiment does not have the notch 110*r* formed in the driving circuit layer 110 in the embodiment of FIG. 1. Instead, a pixel definition layer PDL-A of this embodiment may have an outer edge PDLe" facing away from the pixel opening PO and a notch PDLn recessed from the outer edge PDLe". Through the setting of the notch PDLn, the light emitting pattern LEP and the second electrode E2 later formed may be ruptured at the notch PDLn of the pixel definition layer PDL-A and form the break CUT. Similarly, the protective layer 130 covering the second electrode E2 may also be ruptured at the notch PDLn of the pixel definition layer PDL-A and form a break CUT".

The first encapsulation pattern EP1 of the encapsulation structure ES of the light emitting device LED-A may be filled in the notch PDLn of the pixel definition layer PDL-A through the break CUT between the light emitting pattern LEP and the second electrode E2 and the break CUT" of the protective layer 130. That is, the notch PDLn of the pixel definition layer PDL-A, the break CUT between the light emitting pattern LEP and the second electrode E2, and the break CUT" of the protective layer 130 are all filled with the first encapsulation pattern EP1 of the encapsulation structure ES.

In this embodiment, a process method for defining the protective layer 130 and the process method for defining the light emitting pattern LEP and the second electrode E2 may optionally be the same. For example, in the etching step of forming the light emitting pattern LEP and the second electrode E2 (as shown in FIG. 2D and FIG. 2E), the protective layer 130 may be formed at the same time. That is to say, an edge 130*e* of the protective layer 130 in this embodiment may be aligned with the edge EP1*e* of the first encapsulation pattern EP1, the edge LEPe of the light emitting pattern LEP, and the edge E2*e* of the second electrode E2. In particular, in this embodiment, a dummy electrode DE may be disposed in the notch PDLn of the pixel definition layer PDL-A, and the dummy electrode DE and the first electrode E1 may be in the same film layer. However, the disclosure is not limited thereto.

Figure 7:
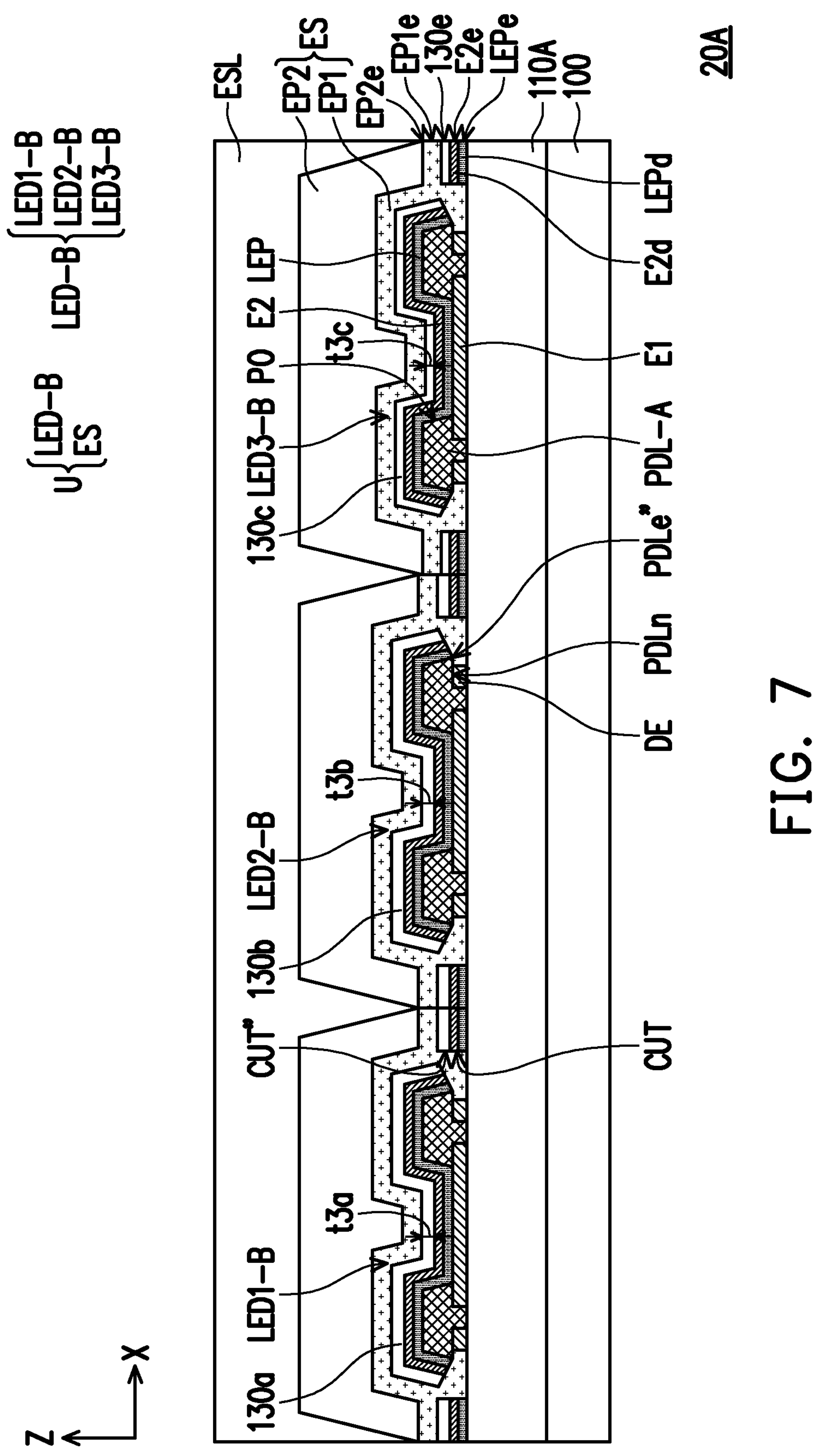
FIG. 7 is a schematic cross-sectional view of a display panel according to the fourth embodiment of the disclosure.
Figure 8:
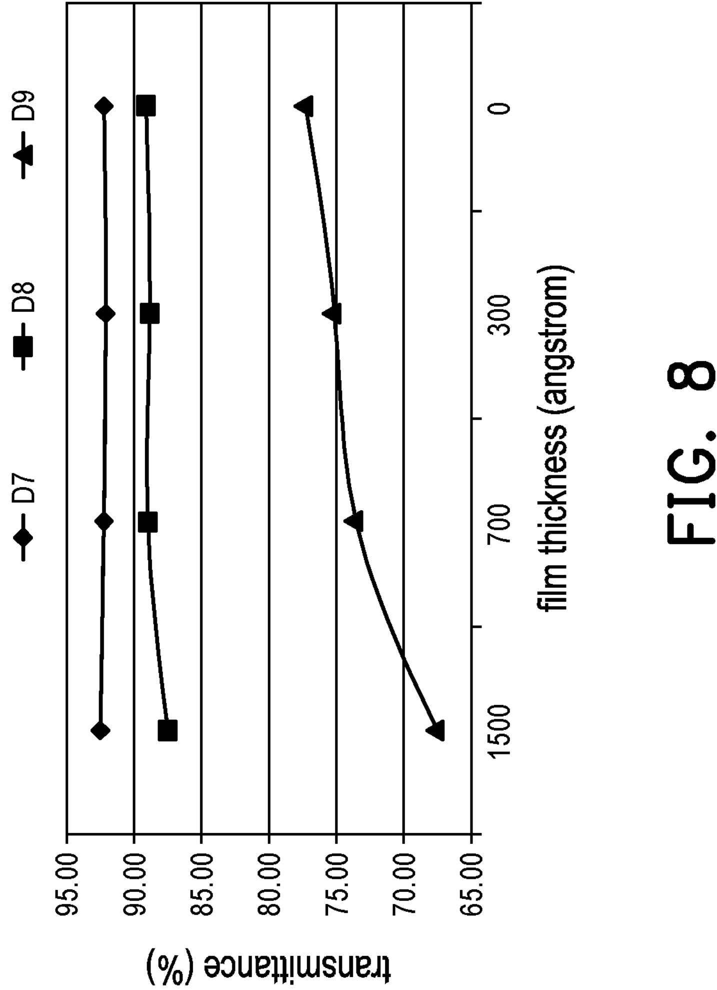
FIG. 8 is a distribution map of transmittance against film thickness of a protective layer of FIG. 7.

FIG. 7 is a schematic cross-sectional view of a display panel according to the fourth embodiment of the disclosure. FIG. 8 is a distribution map of transmittance against film thickness of a protective layer of FIG. 7. For the sake of clarity, FIG. 7 only illustrates three of the display units U of a display panel 20A. Referring to FIG. 7, different from the display panel 20 of the embodiment of FIG. 6, the thicknesses of the protective layers of each of multiple light emitting devices LED-B (for example, a first light emitting device LED1-B, a second light emitting device LED2-B, and the third light emitting device LED3-B) of the display panel 20A of the embodiment are different from each other.

Referring to FIG. 7 and FIG. 8, a distribution D7 shows the transmittance of a protective layer 130*a* of different thicknesses in the light emission waveband (such as the red-light waveband with the wavelength range of 600 nm to 650 nm) of the first light emitting device LED1-B. A distribution D8 shows the transmittance of a protective layer 130*b* of different thicknesses in the light emission waveband (such as the green-light waveband with the wavelength range of 500 nm to 550 nm) of the second light emitting device LED2-B. A distribution D9 shows the transmittance of a protective layer 130*c* of different thicknesses in the light emission waveband (such as the blue-light waveband with the wavelength range of 400 nm to 450 nm) of the third light emitting device LED3-B. It can be seen from the figure that the transmittances of each of the protective layer 130*a* and the protective layer 130*b* for the red-light waveband and the green-light waveband do not significantly change as the film thickness of the protective layer increases. However, the transmittance of the protective layer 130*c* for the blue-light waveband may significantly decrease as the film thickness of the protective layer 130*c* increases. In addition, no matter what the film thickness is, the transmittance of the protective layer 130*a* for the red light is higher than the transmittance of the protective layer 130*b* for the green light, and the transmittance of the protective layer 130*b* for the green light is significantly higher than the transmittance of the second encapsulation pattern EP2*c* for the blue light.

That is to say, when the light emitting colors of the first light emitting device LED1-B, the second light emitting device LED2-B, and the third light emitting device LED3-B are respectively red, green, and blue, a film thickness t3*a* of the layer 130*a* of the protective layer of the first light emitting device LED1-B may be greater than a film thickness t3*b* of the protective layer 130*b* of the second light emitting device LED2-B. The film thickness t3*b* of the protective layer 130*b* of the second light emitting device LED2-B may be greater than a film thickness t3*c* of the third light emitting device LED3-B. In this way, in response to the protective layer still having a protective effect, the maximum amount of light emitted from the display panel 20A may be further increased. Preferably, the film thickness t3*a* of the protective layer 130*a*, the film thickness t3*b* of the protective layer 130*b*, and the film thickness t3*c* of the protective layer 130*c* may be less than or equal to 1500 angstroms.

Since the components not mentioned in this embodiment are similar to the display panel 20 in FIG. 6, please refer to the relevant paragraphs of the above embodiments for detailed description, which are not repeated herein.

Figure 9:
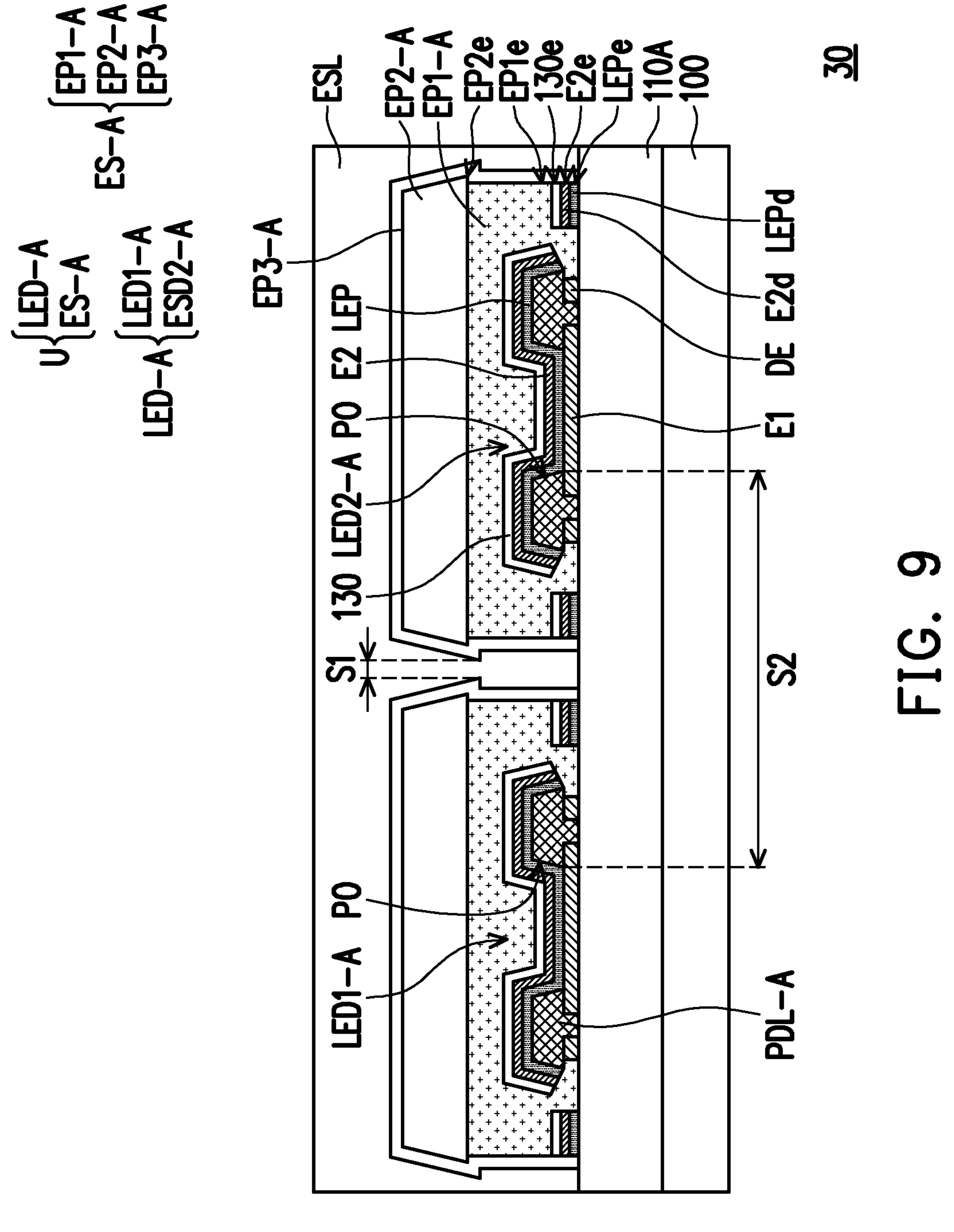
FIG. 9 is a schematic cross-sectional view of a display panel according to the fifth embodiment of the disclosure.

FIG. 9 is a schematic cross-sectional view of a display panel according to the fifth embodiment of the disclosure. For the sake of clarity, FIG. 9 only illustrates two of the display units U of a display panel 30. Referring to FIG. 9, the only difference between the display panel 30 of this embodiment and the display panel 20 of FIG. 6 is that the configuration and arrangement of the encapsulation structures are different.

In the display panel 30 of this embodiment, any two adjacent display units U are not arranged adjacent to each other. For example, a spacing S1 between an encapsulation structure ES-A (i.e., the first encapsulation structure) covering the first light emitting device LED1-A and the encapsulation structure ES-A (i.e., the second encapsulation structure) covering the second light emitting device LED2-A along the direction X may be greater than 0 μm and less than or equal to 10 μm, preferably less than or equal to 5 μm. Preferably, a spacing S2 between the pixel opening PO of the first light emitting device LED1-A and the pixel opening PO of the second light emitting device LED2-A along the direction X is less than 16 μm.

It is particularly noted that, as in FIG. 2D and FIG. 2E of the embodiment, in this embodiment, during the process of using a second encapsulation pattern EP2-A as the hard mask to perform etching on the first encapsulation material layer, the protective material layer, the second electrode layer, and the light emitting material layer, the film layer under the second encapsulation pattern EP2-A may also be undercut by adjusting a etch rate. Therefore, in this embodiment, the second encapsulation pattern EP2-A of the encapsulation structure ES-A protrudes outwards compared to the respective edges of a first encapsulation pattern EP1-A, the light emitting pattern LEP, the second electrode E2 and the protective layer 130.

On the other hand, in order to further improve the encapsulation effect, the encapsulation structure ES-A of this embodiment may further optionally include a third encapsulation pattern EP3-A disposed on the second encapsulation pattern EP2-A. More specifically, the third encapsulation pattern EP3-A covers the edge EP2*e* of the second encapsulation pattern EP2-A, the edge EP1*e* of the first encapsulation pattern EP1-A, the edge 130*e* of the protective layer 130, the edge E2*e* of the second electrode E2 and the edge LEPe of the light emitting pattern LEP. The third encapsulation pattern EP3-A may be the multi-layer film structure of the inorganic material (for example, the silicon nitride) and the organic material (for example, acrylic, epoxy, hexamethyldisiloxane (HMDSO), or other applicable organic materials). For example, the third encapsulation pattern EP3-A may be the three-layer film structure of the inorganic material, the organic material, and the inorganic material. However, the disclosure is not limited thereto.

Figures 10, 11:
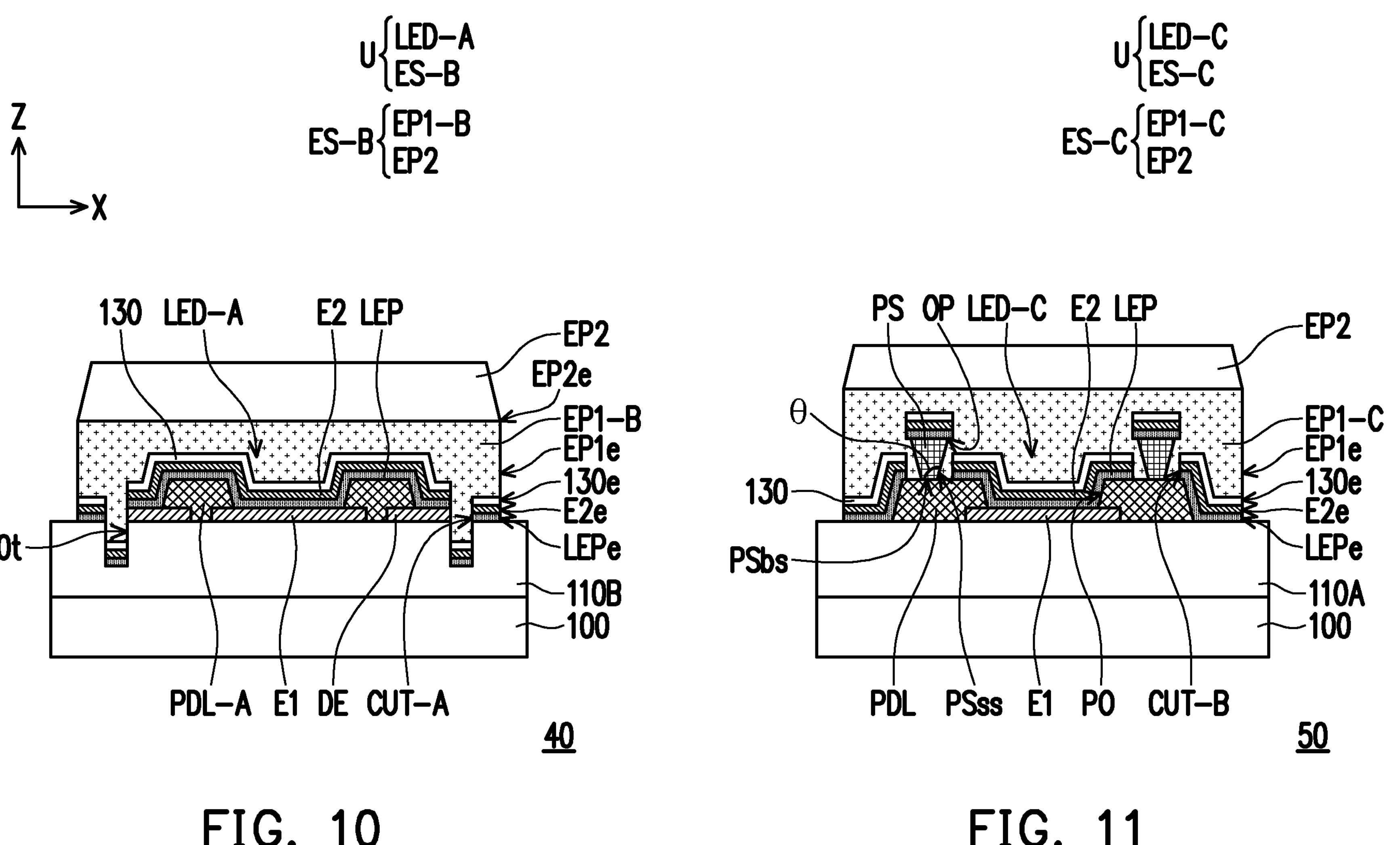
FIG. 10 is a schematic cross-sectional view of a display panel according to the sixth embodiment of the disclosure.
FIG. 11 is a schematic cross-sectional view of a display panel according to the seventh embodiment of the disclosure.

FIG. 10 is a schematic cross-sectional view of a display panel according to the sixth embodiment of the disclosure. For the sake of clarity, FIG. 10 only illustrates one of the display units U of a display panel 40. Referring to FIG. 10, different from the display panel 20 of FIG. 6 using the notch PDLn of the pixel definition layer PDL-A to form the break CUT between the light emitting pattern LEP and the second electrode E2, in this embodiment, the display panel 40 uses a concave 110*t* of a driving circuit layer 110B to form a break point CUT-A of the light emitting pattern LEP, the second electrode E2, and the protective layer 130.

In detail, the driving circuit layer 110B may be provided with a concave 110*t* outside the pixel opening PO of the pixel definition layer PDL-A. The concave 110*t* does not overlap the pixel definition layer PDL-A, and is, for example, provided in a planarization layer (not shown) of the driving circuit layer 110B. In particular, the dummy electrode DE partially overlapping the pixel definition layer PDL-A extends in a direction away from the pixel definition layer PDL-A to the concave 110*t* of the driving circuit layer 110B.

Through the concave 110*t* of the driving circuit layer 110B, the light emitting pattern LEP, the second electrode E2 and the protective layer 130 may have the break CUT-A overlapping the concave 110*t*. Therefore, a first encapsulation pattern EP1-B of a subsequently formed encapsulation structure ES-B may be filled into the concave 110*t* of the driving circuit layer 110B through the break CUT-A of the light emitting pattern LEP, the second electrode E2, and the protective layer 130, to completely cover the part of the light emitting pattern LEP that is electrically connected to the first electrode E1. Accordingly, it is possible to avoid the failure of the encapsulation of the light emitting device LED-A previously formed during the manufacturing process of the light emitting device LED-A formed later, causing the light emitting pattern LEP to be oxidized and unable to be lit. Therefore, the production yield of the display panel 40 may be greatly improved.

FIG. 11 is a schematic cross-sectional view of a display panel according to the seventh embodiment of the disclosure. For the sake of clarity, FIG. 11 only illustrates one of the display units U of a display panel 50. Referring to FIG. 11, different from the display panel 20 of FIG. 6, the notch PDLn of the pixel definition layer PDL-A is used to form the break CUT between the light emitting pattern LEP and the second electrode E2. In this embodiment, the display panel 50 uses a gap layer PS of a light emitting device LED-C is used to form a break CUT-B of the light emitting pattern LEP, the second electrode E2, and the protective layer 130.

Specifically, the gap layer PS is disposed on the pixel definition layer PDL and has an opening OP overlapping the pixel opening PO of the pixel definition layer PDL, a bottom surface PSbs connected to the pixel definition layer PDL, and a side surface PSss connected to the bottom surface PSbs. In particular, an angle θ between the side surface PSss and the bottom surface PSbs of the gap layer PS is greater than or equal to 90 degrees. For example, in this embodiment, a cross-sectional profile of the gap layer PS is generally an inverted trapezoid, but it is not limited thereto.

The light emitting pattern LEP, the second electrode E2, and the protective layer 130 may have the break CUT-B corresponding to the side surface PSss of the gap layer PS through the disposition of the gap layer PS. Therefore, a first encapsulation pattern EP1-C of a subsequently formed encapsulation structure ES-C may cover the side surface PSss of the gap layer PS through the break CUT-B of the light emitting pattern LEP, the second electrode E2, and the protective layer 130, to completely cover the part of the light emitting pattern LEP that is electrically connected to the first electrode E1. Accordingly, it is possible to avoid the failure of the encapsulation of the light emitting device LED-C previously formed during the manufacturing process of the light emitting device LED-C formed later, causing the light emitting pattern LEP to be oxidized and unable to be lit. Therefore, the production yield of the display panel 50 may be greatly improved.

Figure 12:
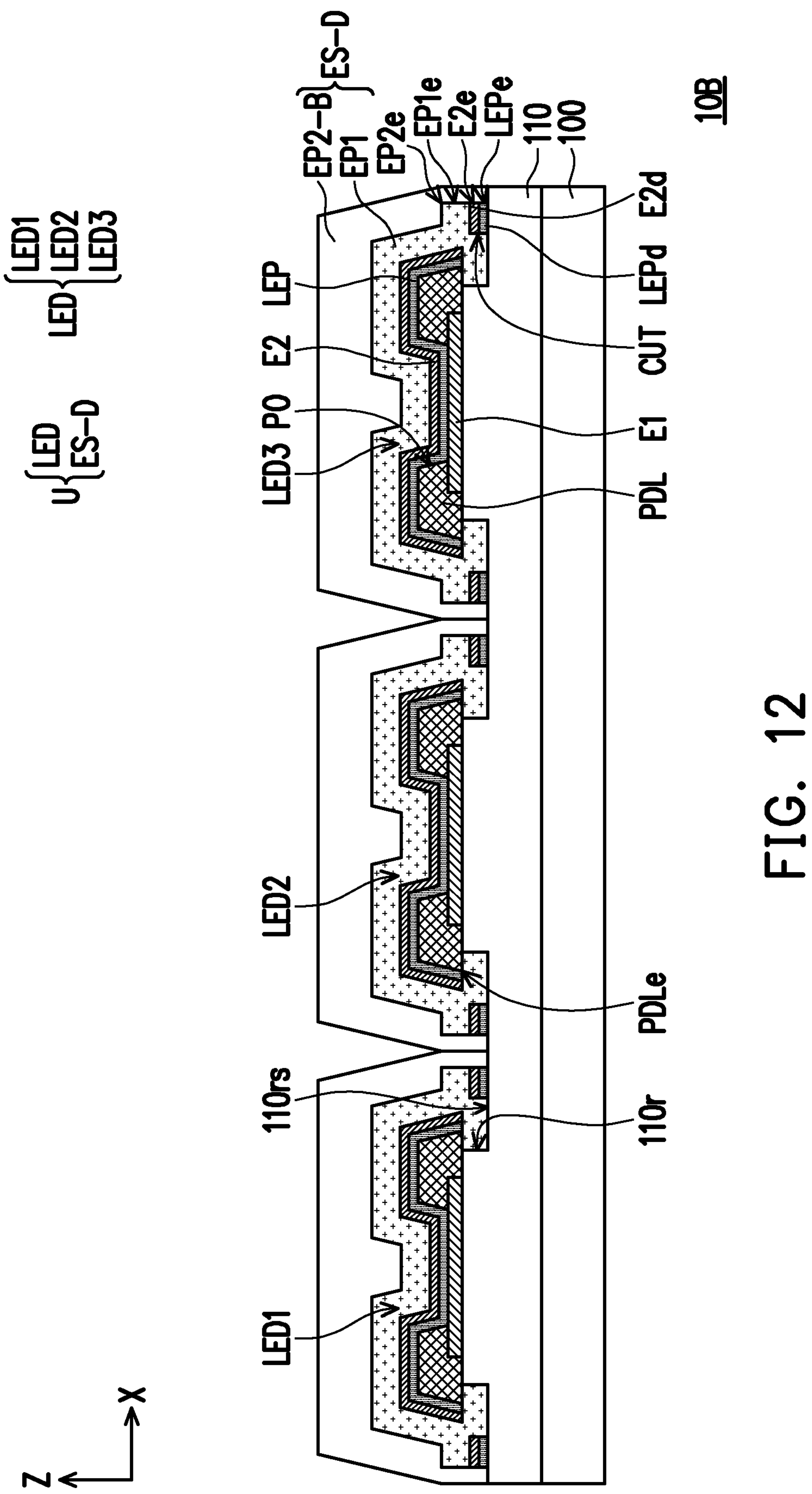
FIG. 12 is a schematic cross-sectional view of a display panel according to the eighth embodiment of the disclosure.

FIG. 12 is a schematic cross-sectional view of a display panel according to the eighth embodiment of the disclosure. For the sake of clarity, FIG. 12 only illustrates three of the display units U of a display panel 10B. Referring to FIG. 12, different from the display panel 10 of FIG. 1, in the display panel 10B of this embodiment, the edge EP2*e* of a second encapsulation pattern EP2-B of an encapsulation structure ES-D is not aligned with the edge EP1*e* of the first encapsulation pattern EP1, the edge LEPe of the light emitting pattern LEP, and the edge E2*e* of the second electrode E2.

More specifically, the second encapsulation pattern EP2-B of this embodiment covers the edge EP1*e* of the first encapsulation pattern EP1, the edge LEPe of the light emitting pattern LEP, and the edge E2*e* of the second electrode E2, so as to further improve a water oxygen resistance of the encapsulation structure ES-D, thereby improving the overall encapsulation effect of the display panel 10B.

Figure 13:
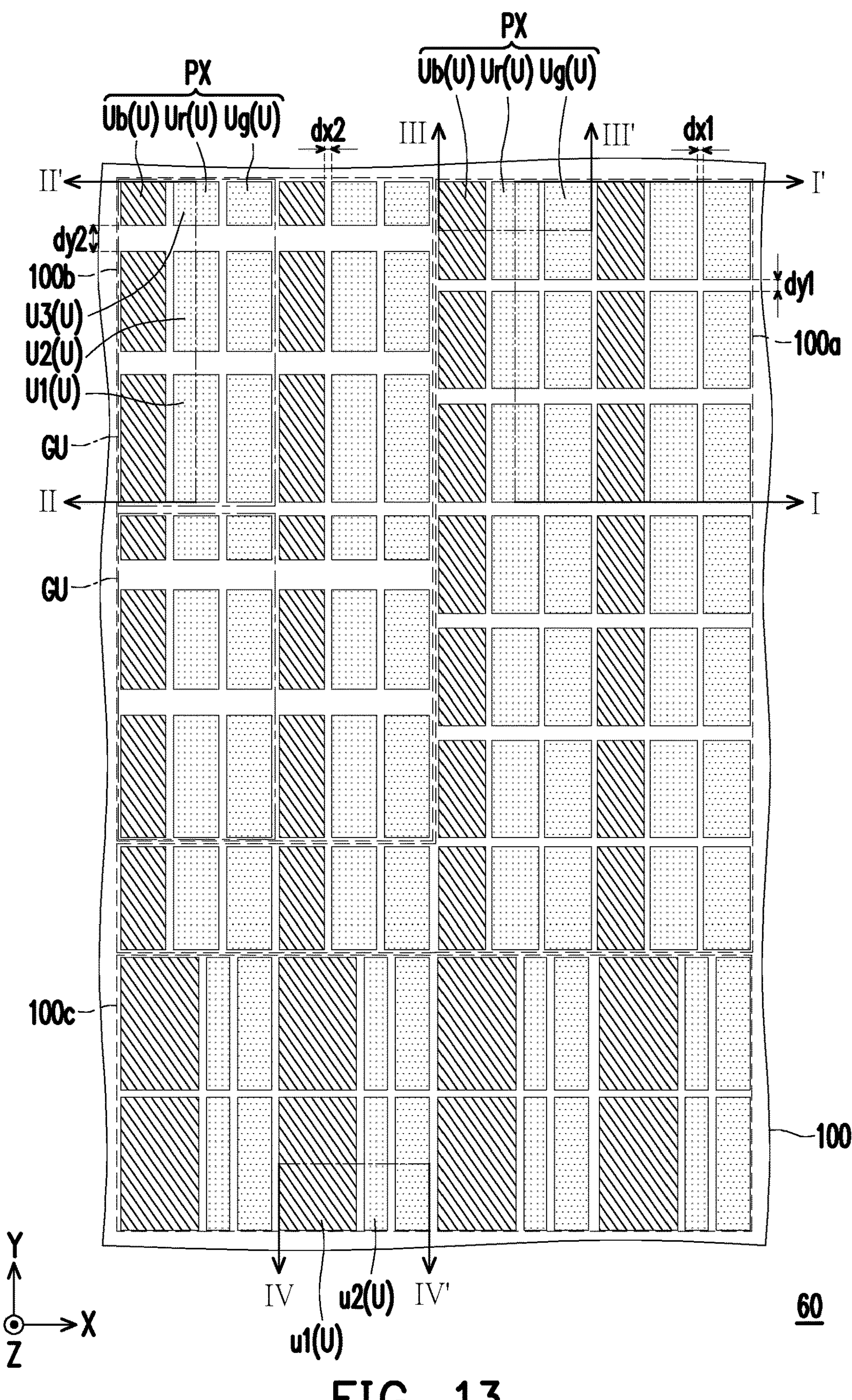
FIG. 13 is a schematic top view of a display panel according to the ninth embodiment of the disclosure.
Figure 14:
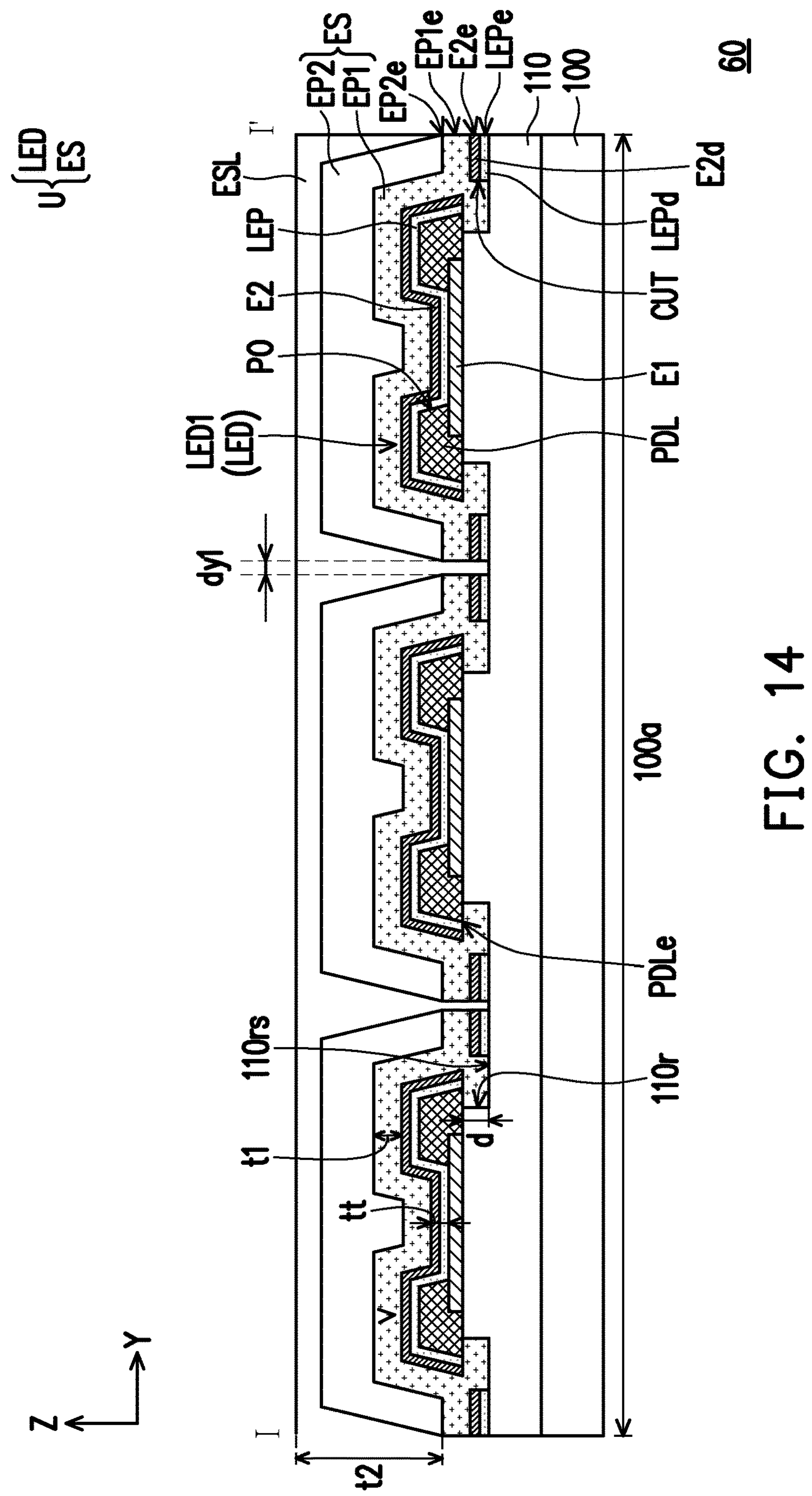
FIG. 14 is a schematic cross-sectional view of a display panel according to the ninth embodiment of the disclosure.
Figure 15:
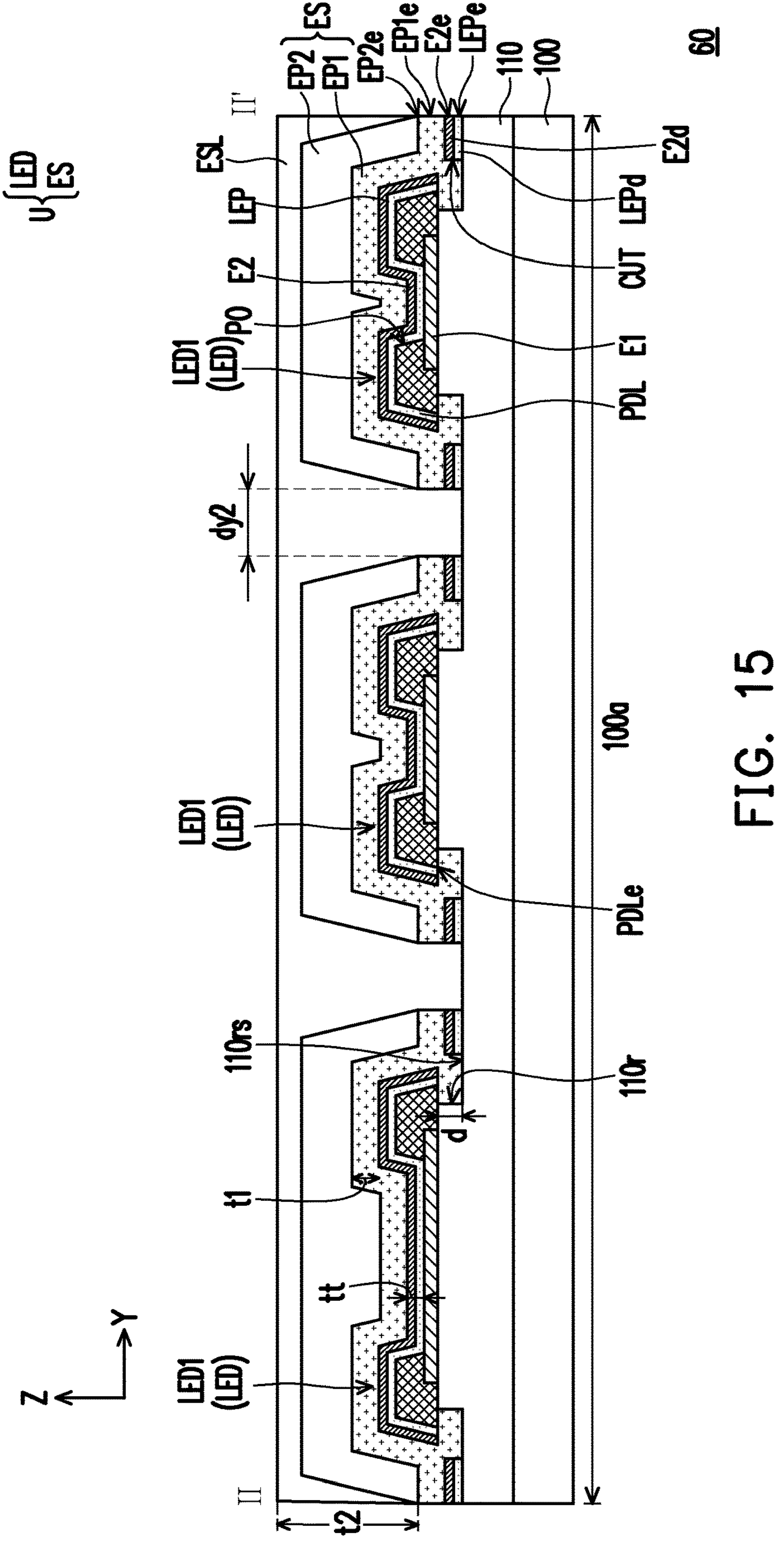
FIG. 15 is a schematic cross-sectional view of a display panel according to the ninth embodiment of the disclosure.
Figure 16:
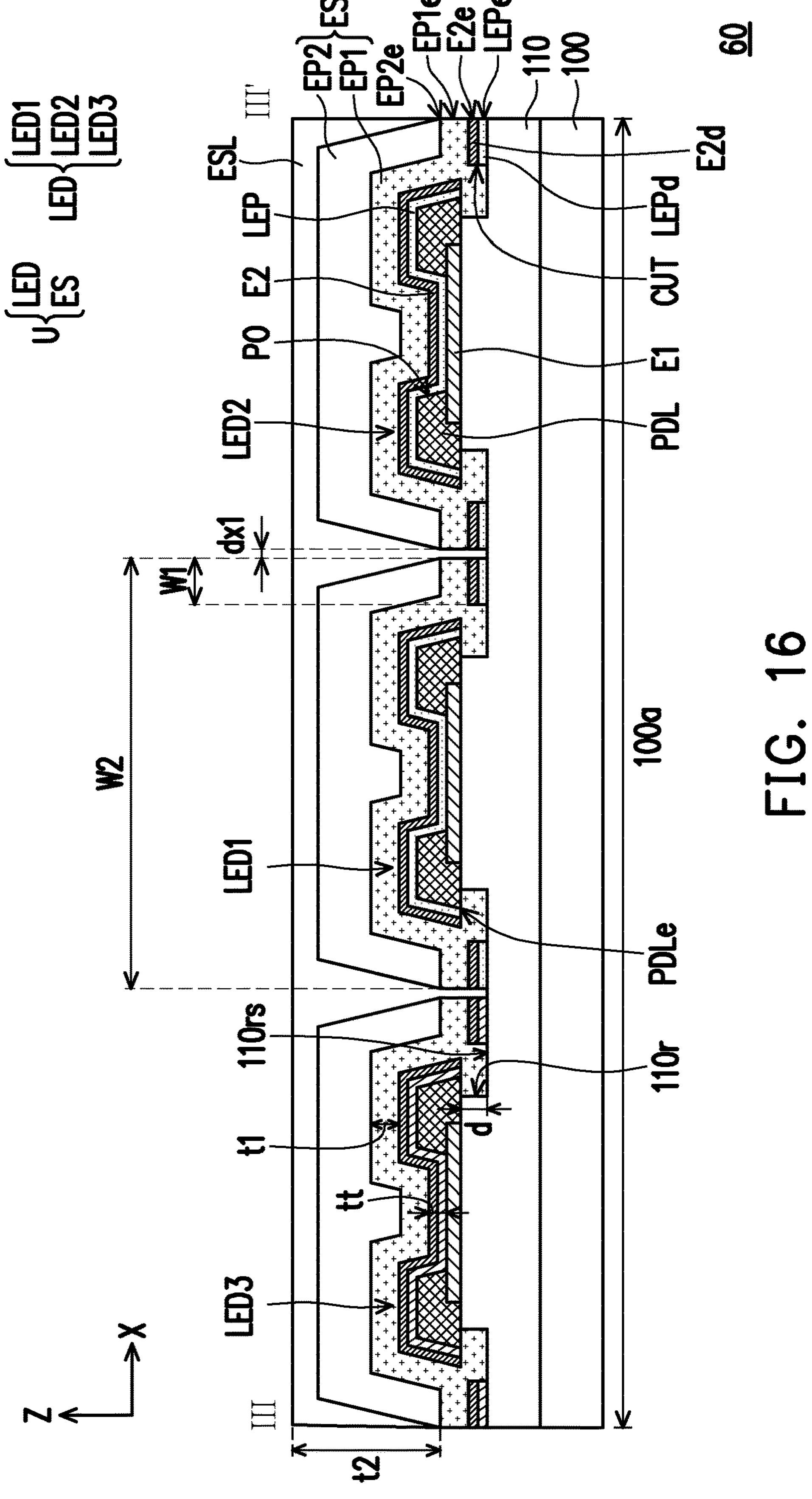
FIG. 16 is a schematic cross-sectional view of a display panel according to the ninth embodiment of the disclosure.
Figure 17:
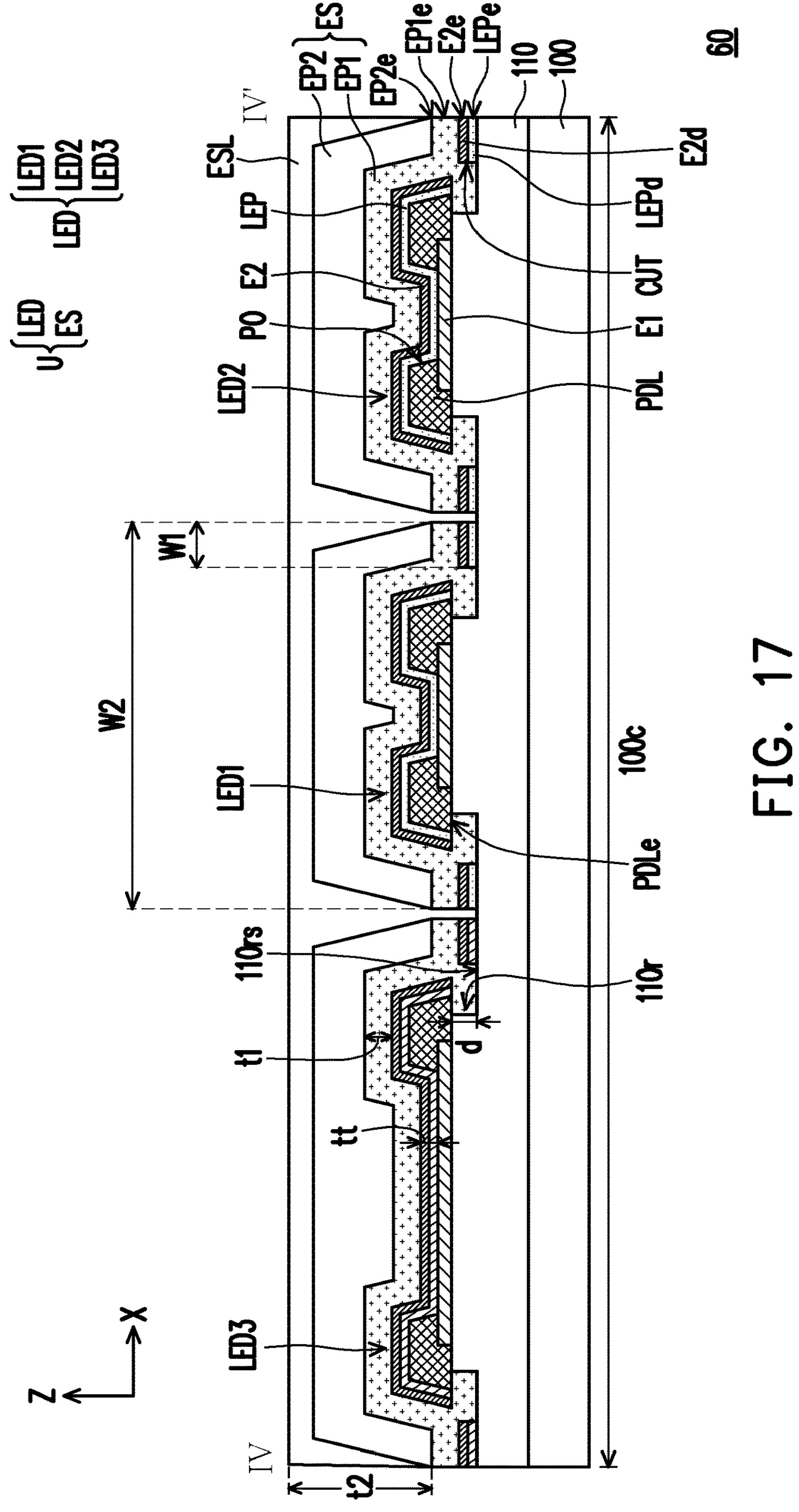
FIG. 17 is a schematic cross-sectional view of a display panel according to the ninth embodiment of the disclosure.

FIG. 13 is a schematic top view of a display panel according to the ninth embodiment of the disclosure. FIG. 14 is a schematic cross-sectional view of a display panel according to the ninth embodiment of the disclosure. FIG. 15 is a schematic cross-sectional view of a display panel according to the ninth embodiment of the disclosure. FIG. 16 is a schematic cross-sectional view of a display panel according to the ninth embodiment of the disclosure. FIG. 17 is a schematic cross-sectional view of a display panel according to the ninth embodiment of the disclosure. FIGS. 14, 15, 16 and 17 respectively correspond to multiple cross-section lines I-I', II-II', III-III', and IV-IV' of FIG. 13. FIG. 13 shows the substrate 100 of the display panel 60 and the display units U, while other components of the display panel 60 are omitted. For the sake of clarity, three intersecting directions X, Y, and Z are shown in FIG. 13 to FIG. 17.

Please refer to FIGS. 13, 14 and 15. Different from the above embodiments, the substrate 100 of the display panel 60 has a normal display area 100*a* and a penetrating display area 100*b* outside the normal display area 100*a*. In an embodiment, the normal display area 100*a* may refer to an area used to display images that frequently need to be changed, and the transparent display area 100*b* may refer to an area with a high light transmittance. The light transmittance of the penetrating display area 100*b* is higher than the light transmittance of the normal display area. The penetrating area 100*b* may also be called a transparent display area. In an embodiment, photosensitive elements (such as under-screen imaging elements, environmental light sensing elements, etc.; not shown) may be optionally disposed at the rear of the penetrating display area 100*b*. However, the disclosure is not limited thereto. In an embodiment, the display panel 60 further includes a permanent image display area 100*c* outside the normal display area 100*a* and the transparent display area 100*b*. The permanent image display area 100*c* may refer to an area used to display images that do not need to be changed frequently, such as but not limited to: an area below a computer desktop where a toolbar is displayed.

Referring to FIG. 13 and FIG. 15, in order to achieve a high transmittance of the penetrating display area 100*b*, there may be no light emitting pattern LEP disposed between two adjacent display units U in the penetrating display area 100*b*. That is to say, the light emitting patterns LEP of two adjacent display units U in the penetrating display area 100*b* have a distance dy2. Referring to FIG. 13 and FIG. 16, in an embodiment, the display units U include multiple display units Ur, multiple display units Ug and multiple display units Ub. Each of the display unit Ur includes a light emitting device LED1 for emitting a first color light (for example: the red light). Each of the display unit Ug includes a second light emitting device LED2 for emitting a second color light (for example: the green light). Each of the display unit Ub includes a third light emitting device LED3 for emitting the third color light (for example: the blue light). One display unit Ur, one display unit Ug and one display unit Ub adjacent to each other constitute a pixel PX. The display unit Ur, the display unit Ug, and the display unit Ub of the pixel PX are arranged in the direction X. Referring to FIG. 13 and FIG. 15, in an embodiment, the light emitting patterns LEP of two adjacent display units U disposed in the penetrating display area 100*b* may have the distance dy2 in the direction Y intersecting with the direction X. Referring to FIG. 13, in an embodiment, the light emitting patterns LEP of the two adjacent display units U disposed in the penetrating display area 100*b* may also optionally have a distance dx2 in the direction X. However, the disclosure is not limited thereto.

Referring to FIG. 13, FIG. 14 and FIG. 15, in an embodiment, the distance dy2 between the light emitting patterns LEP of the two adjacent display units U in the penetrating display area 100*b* is greater than a distance dy1 of the light emitting patterns LEP of two adjacent display units U in the normal display area 100*a*. For example, in an embodiment, the display unit Ur, the display unit Ug, and the display unit Ub of the pixel PX are arranged in the direction X. The distance dy2 of the light emitting patterns LEP of the two adjacent display units U disposed on the penetrating display area 100*b* in the direction Y intersecting the direction X is greater than the distance dy1 of the light emitting patterns LEP of the two adjacent display units U disposed on the normal display area 100*a* in the direction Y. In an embodiment, a distance dx2 (marked in FIG. 13) of the light emitting patterns LEP of the two adjacent display units U disposed on the penetrating display area 100*b* in the direction Y may be optionally equal to a distance dx1 of the light emitting patterns LEP of the two adjacent display units U disposed on the normal display area 100*a* in the direction Y. However, the disclosure is not limited thereto. In another embodiment not shown, the distance dx2 of the light emitting patterns LEP of the two adjacent display units U disposed on the penetrating display area 100*b* in the direction X may be greater than the distance dx1 of the light emitting patterns LEP of the two adjacent display units U disposed on the normal display area 100*a* in the direction X; in another embodiment not shown, the distances dx2 and dy2 of the light emitting patterns LEP of the two adjacent display units U disposed on the penetrating display area 100*b* in the direction X and the direction Y may be respectively greater than the distances dx1 and dy1 of the light emitting patterns LEP of the two adjacent display units U disposed on the normal display area 100*a* in the direction X and the direction Y.

Referring to FIG. 13 and FIG. 15, in an embodiment, the display units U disposed on the penetrating display area 100*b* include multiple first display units U1, multiple second display units U2 and multiple third display units U3. The area of the pixel opening PO of each of the first display units U1 is greater than the area of the pixel opening PO of each of the second display units U2. The area of the pixel opening PO of each of the second display units U2 is greater than the area of the pixel opening PO of each of the third display units U3. The display units U are divided into multiple display unit groups GU. Each of the display unit groups GU includes one first display unit U1, one second display unit U2, and one third display unit U3 sequentially arranged in the direction Y. One first display unit U1, one second display unit U2, and one third display unit U3 of the same display unit group GU are used to display the same color, and the display unit groups GU are arranged in the direction Y. That is to say, in the penetrating display area 100*b*, the light emitting areas of the display units U that are adjacent to each other and used to display the same color may be different. Thereby, in response to the penetrating display area 100*b* having the higher light transmittance, a resolution of the penetrating display area 100*b* (i.e., the number of the pixels PX per unit area) may be the same as a resolution of the normal display area 100*a*, thereby improving a visual effect of the display panel 60 and preventing the user from noticing a sudden drop in a picture quality when looking from the normal display area 100*a* to the penetrating display area 100*b*. In addition, in an embodiment, the display units U disposed in the penetrating display area 100*b*, adjacent to each other and used to display the same color, have various light emitting areas of different sizes. In this way, images may be displayed with an extreme low gray scale by a writing of a Gamma value.

Referring to FIG. 13 and FIG. 15, in an embodiment, the first display unit U1, the second display unit U2 and the third display unit U3 of each of the display unit groups GU are used to display the same color. A current provided to the first electrode E1 of the first display unit U1, a current provided to the first electrode E1 of the second display unit U2, and a current provided to the first electrode E1 of the third display unit U3 may be different form each other. Different current values are given according to the sizes of the pixel openings PO of the first display unit U1, the second display unit U2, and the third display unit U3, thereby achieving a uniformed brightness between the first display unit U1, the second display unit U2, and the third display unit U3, and a display consistency in visual. In an embodiment, different current values may be controlled by a driving chip and given to the first display unit U1, the second display unit U2, and the third display unit U3. However, the disclosure is not limited thereto. In other embodiments, different current values may be given to the first display unit U1, the second display unit U2, and the third display unit U3 through other methods. For example, in another embodiment, a channel width-to-length ratio of multiple thin film transistors electrically connected to the first display unit U1, the second display unit U2, and the third display unit U3 may be designed as different numerical values to give different current values to the first display unit U1, the second display unit U2, and the third display unit U3.

Referring to FIG. 13 and FIG. 17, in an embodiment, the display units U include multiple first color display units u1 for displaying a first color and multiple second color display units u2 for displaying a second color. The area of the pixel opening PO of one first color display unit u1 and the area of the pixel opening PO of one second color display unit u2 that are disposed in the permanent image display area 100*c* and adjacent to each other are different. For example, in one embodiment, the permanent image display area 100*c* is most commonly used to display images of a certain color (e.g., the blue color). The first color display unit u1 is used to display the image of the certain color (e.g., the blue color). The second color display unit u2 is used to display other colors (e.g., the red color or the green color). The area of the pixel opening PO of the first color display unit u1 may be greater than the area of the pixel opening PO of the second color display unit u2. Thereby, an overall service life of the permanent image display area 100*c* may be extended.

Figure 18:
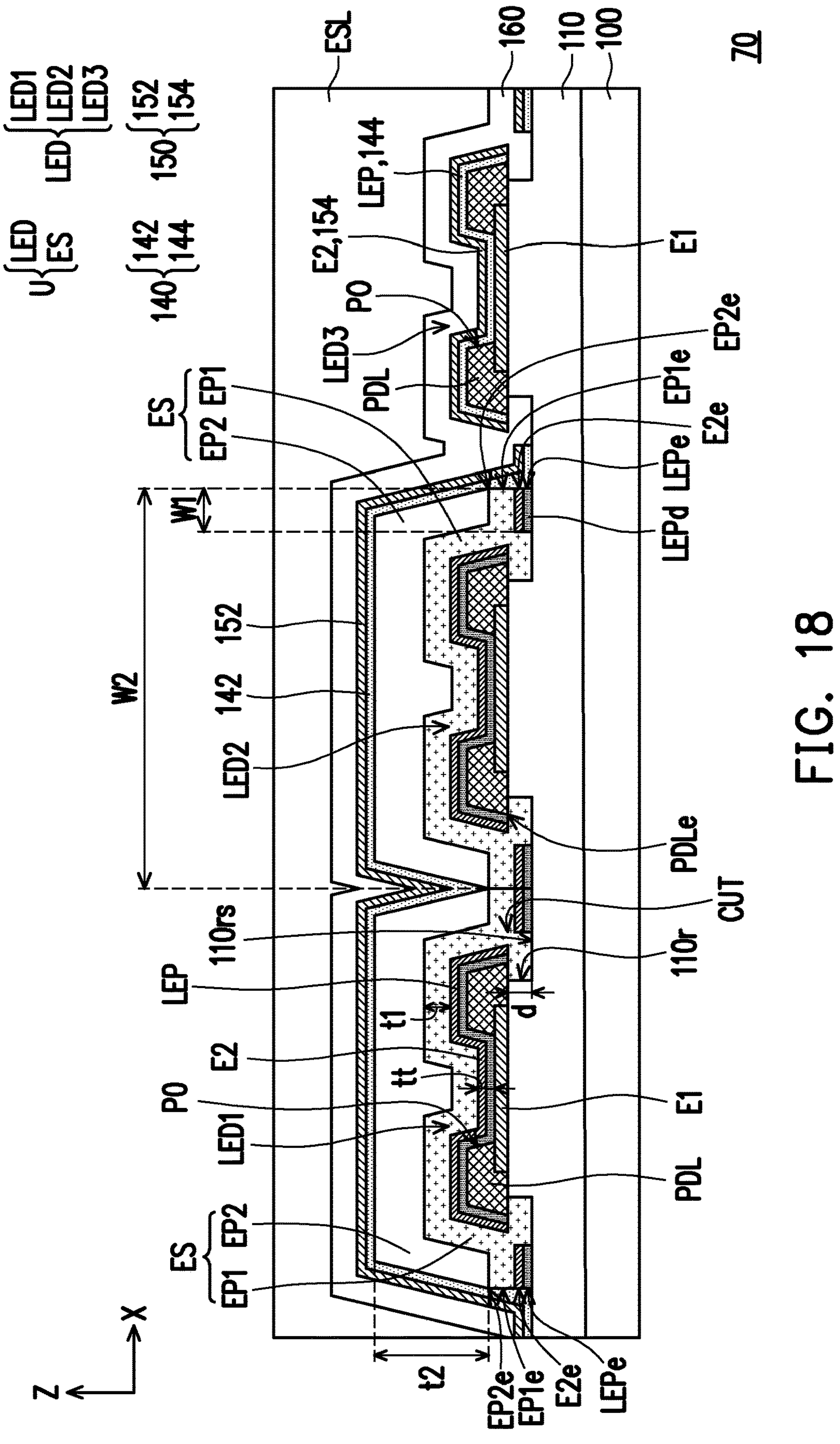
FIG. 18 is a schematic cross-sectional view of a display panel according to the tenth embodiment of the disclosure.

FIG. 18 is a schematic cross-sectional view of a display panel according to the tenth embodiment of the disclosure.

Referring to FIG. 18, different from the above embodiment, a display panel 70 further includes a light emitting layer 140. The light emitting layer 140 includes a dummy part 142. The dummy part 142 is provided on the encapsulation structures ES covering the first light emitting device LED1 and the second light emitting device LED2 respectively. The dummy part 142 of the light emitting layer 140 extends beyond the encapsulation structures ES covering the first light emitting device LED1 and the second light emitting device LED2 respectively. The dummy part 142 of the light emitting layer 140 extends beyond the edge EP1*e* of the first encapsulation pattern EP1, the edge LEPe of the light emitting pattern LEP, and the edge E2*e* of the second electrode E2 that are aligned with each other. The light emitting layer 140 further includes a light emitting part 144 disconnected from the dummy part 142. The light emitting part 144 is the light emitting pattern LEP of the third light emitting device LED3. The light emitting pattern LEP of the third light emitting device LED3 and the dummy part 142 provided on the encapsulation structures ES belong to the same light emitting layer 140.

Referring to FIG. 18, the display panel 70 further includes a conductive layer 150. The conductive layer 150 includes a first part 152. The first part 152 is disposed on the encapsulation structures ES covering the first light emitting device LED1 and the second light emitting device LED2 respectively. The first part 152 of the conductive layer 150 extends beyond the encapsulation structures ES covering the first light emitting device LED1 and the second light emitting device LED2 respectively. The first part 152 of the conductive layer 150 extends beyond the edge EP1*e* of the first encapsulation pattern EP1, the edge LEPe of the light emitting pattern LEP, and the edge E2*e* of the second electrode E2 that are aligned with each other. The conductive layer 150 also includes a second part 154 disconnected from the first part 152. The second part 154 is the second electrode E2 of the third light emitting device LED3. The second electrode E2 of the third light emitting device LED3 and the first part 152 provided on the encapsulation structures ES belong to the same conductive layer 150.

Referring to FIG. 18, the display panel 70 further includes an auxiliary encapsulation layer 160. The auxiliary encapsulation layer 160 covers the conductive layer 150 and is located between the encapsulation layer ESL and the conductive layer 150. A part of the auxiliary encapsulation layer 160 is used to encapsulate the third light emitting device LED3.

It is worth noting that in this embodiment, after the light emitting layer 140 is formed, the light emitting pattern LEP of the third light emitting device LED3 may be formed without performing a patterning process on the light emitting layer 140, which helps to simplify the manufacturing process of the display panel 70. In addition, in this embodiment, the second encapsulation pattern EP2 is not provided on the third light emitting device LED3, which may improve the transmittance.

To sum up, in the display panel according to an embodiment of the disclosure, the light emitting pattern of the light emitting device and the second electrode extend from within the pixel opening of the pixel definition layer to outside the pixel opening, and cover the pixel definition layer. Using the encapsulation structure as a hard mask to define the light emitting pattern and the second electrode may not only increase the alignment accuracy of the process, but also avoid the problem of causing the light emitting pattern previously formed during the manufacturing process to be oxidized and unable to be lit.

What is claimed is:

1. A display panel, comprising:

a driving circuit layer;

a plurality of light emitting devices, disposed on the driving circuit layer and each comprising:

a first electrode;

a light emitting pattern, disposed on the first electrode;

a second electrode, disposed on the light emitting pattern; and a pixel definition layer, disposed on the driving circuit layer and having a pixel opening overlapping the first electrode, wherein the light emitting pattern and the second electrode cover the pixel definition layer, the first electrode located within the pixel opening of the pixel definition layer, and part of the driving circuit layer located outside the pixel opening of the pixel definition layer, and the light emitting pattern is electrically connected to the first electrode through the pixel opening; and a plurality of encapsulation structures, covering the light emitting devices, wherein each of the encapsulation structures comprises a first encapsulation pattern, wherein edges of the first encapsulation pattern, the light emitting pattern, and the second electrode overlapping with each other are aligned with each other;

wherein the light emitting devices comprise a first light emitting device and a second light emitting device, a light emitting color of the first light emitting device is different from a light emitting color of the second light emitting device, the encapsulation structures comprise a first encapsulation structure covering the first light emitting device and a second encapsulation structure covering the second light emitting device, and materials or film thicknesses of the first encapsulation pattern of the first encapsulation structure and the first encapsulation pattern of the second encapsulation structure are different.

2. The display panel according to claim 1, wherein the driving circuit layer has a notch overlapping an outer edge of the pixel definition layer of each of the light emitting devices, and the light emitting pattern of each of the light emitting devices and the second electrode have a break corresponding to the notch, the notch of the driving circuit layer and the break between the light emitting pattern and the second electrode are filled with the first encapsulation pattern of one of the encapsulation structures.

3. The display panel according to claim 2, wherein each of the light emitting devices further comprises:

a protective layer, disposed between the second electrode and one of the encapsulation structures and covering the second electrode, wherein the protective layer has a break corresponding to the notch, and the break of the protective layer is filled with the first encapsulation pattern of the one of the encapsulation structures, and a material of the protective layer comprises a transparent conductive material.

4. The display panel according to claim 3, wherein an edge of the protective layer is aligned with each of the edges of the first encapsulation pattern, the light emitting pattern, and the second electrode.

5. The display panel according to claim 2, wherein the light emitting pattern and the second electrode of each of the light emitting devices have a dummy part that does not overlap the pixel definition layer and is located outside the pixel opening of the pixel definition layer, and the dummy part extends from each of the edges of the light emitting pattern and the second electrode to the break between the light emitting pattern and the second electrode.

6. The display panel according to claim 5, wherein a ratio of a width of the dummy part of the light emitting pattern along one direction to a width of the first encapsulation pattern along the direction is in a range of 0.04 to 0.2.

7. The display panel according to claim 2, wherein a distance between a notch bottom surface of the notch defined by the driving circuit layer and the pixel definition layer to a total film thickness of the second electrode of the light emitting pattern is in a range of 1 to 3.

8. The display panel according to claim 1, wherein each of the encapsulation structures further comprises a second encapsulation pattern disposed on the first encapsulation pattern, an edge of the second encapsulation pattern is aligned with the each of the edges of the first encapsulation pattern, the light emitting pattern, and the second electrode.

9. The display panel according to claim 1, wherein each of the encapsulation structures further comprises:

a second encapsulation pattern, covering the first encapsulation pattern, wherein an edge of the second encapsulation pattern protrudes outwards compared to each of the edges of the first encapsulation pattern, the light emitting pattern, and the second electrode; and a third encapsulation pattern, disposed on the second encapsulation pattern and covering the edge of the second encapsulation pattern and each of the edges of the first encapsulation pattern, the light emitting pattern, and the second electrode.

10. The display panel according to claim 1, wherein each of the encapsulation structures further comprises a second encapsulation pattern disposed on the first encapsulation pattern, and the second encapsulation pattern covers each of the edges of the first encapsulation pattern, the light emitting pattern, and the second electrode.

11. The display panel according to claim 1, wherein each of the light emitting devices further comprises:

a gap layer, provided on the pixel definition layer and located between the pixel definition layer and the light emitting pattern, wherein the gap layer has an opening overlapping the pixel opening of the pixel definition layer, and is connected to a bottom surface of the pixel definition layer and a side surface defining the opening and connected to the bottom surface, and an angle between the side surface and the bottom surface is greater than or equal to 90 degrees.

12. The display panel according to claim 1, wherein the light emitting devices and the encapsulation structures constitute a plurality of display units, and each of the display units comprises one of the light emitting devices and one of the encapsulation structures overlapping with each other; the display panel has a penetrating display area, and there is a distance between a plurality of light emitting patterns of two adjacent display units disposed in the penetrating display area.

13. The display panel according to claim 12, wherein the display panel further comprises a normal display area outside the penetrating display area, and the distance between the light emitting patterns of the two adjacent display units disposed in the penetrating display area is greater than a distance of a plurality of light emitting patterns of the two adjacent display units disposed in the normal display area.

14. The display panel according to claim 12, wherein a plurality of display units disposed in the penetrating display area comprise a plurality of first display units and a plurality of second display units, an area of the pixel opening of each of the first display units is greater than an area of the pixel opening of each of the second display units, the display units are divided into a plurality of display unit groups, each of the display unit groups comprises one of the first display units and one of the second display unit sequentially arranged in a direction, and the display unit groups are arranged in the direction.

15. The display panel according to claim 14, wherein the one of the first display units and the one of the second display of the each of the display unit groups are used to display the same color, and a current provided to the first electrode of the one of the first display units and a current provided to the first electrode of the one of the second display units are different form each other.

16. The display panel according to claim 12, wherein the display panel further comprises a permanent image display area outside the penetrating display area, and the display units comprise a plurality of first color display units respectively used to display a first color and a plurality of second color display units used to display a second color, areas of a plurality of pixel openings of one of the first color display units and one of the second color display units disposed in the permanent image display area and adjacent to each other are different.

17. The display panel according to claim 1, wherein the display panel further comprises:

a light emitting layer, comprising:

a dummy part, provided on the encapsulation structures; and a light emitting part, being the light emitting pattern of the third light emitting device and disconnected from the dummy part.

* * * * *